United States Patent
Iwakura et al.

(10) Patent No.: US 10,368,041 B2
(45) Date of Patent: Jul. 30, 2019

(54) IMAGING DEVICE, IMAGING SYSTEM, AND IMAGE PROCESSING METHOD

(71) Applicant: CANON KABUSHIKI KAISHA, Tokyo (JP)

(72) Inventors: Yasushi Iwakura, Kawaguchi (JP); Fujio Kawano, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/432,280

(22) Filed: Feb. 14, 2017

(65) Prior Publication Data
US 2017/0257605 A1   Sep. 7, 2017

(30) Foreign Application Priority Data

Mar. 1, 2016   (JP) .................................. 2016-038706

(51) Int. Cl.
| | |
|---|---|
| *H04N 9/04* | (2006.01) |
| *H01L 27/146* | (2006.01) |
| *H04N 5/357* | (2011.01) |
| *H04N 5/374* | (2011.01) |
| *H04N 5/378* | (2011.01) |

(52) U.S. Cl.
CPC ....... *H04N 9/045* (2013.01); *H01L 27/14607* (2013.01); *H01L 27/14645* (2013.01); *H04N 5/357* (2013.01); *H04N 5/374* (2013.01); *H04N 5/378* (2013.01)

(58) Field of Classification Search
CPC ........ H04N 9/045; H04N 5/378; H04N 5/374; H04N 5/357; H01L 27/14607; H01L 27/14645
See application file for complete search history.

(56) References Cited

U.S. PATENT DOCUMENTS

| | | | |
|---|---|---|---|
| 9,413,964 B2 | 8/2016 | Kawano | |
| 2008/0303919 A1* | 12/2008 | Egawa | G06T 1/0007 348/223.1 |
| 2012/0257821 A1* | 10/2012 | Saito | G06T 3/4015 382/162 |
| 2015/0103212 A1* | 4/2015 | Saito | H04N 9/045 348/242 |

(Continued)

FOREIGN PATENT DOCUMENTS

JP   2011-91483   5/2011

*Primary Examiner* — Timothy J Henn
(74) *Attorney, Agent, or Firm* — Venable LLP

(57) ABSTRACT

An imaging device has: a pixel unit including a first pixel and second pixels arranged around the first pixel and adapted to provide more brightness information than is provided by the first pixel; a directional property determination unit that determines a direction of an intensity distribution based on differences of the values of the second pixels; a correlation value calculation unit that calculates a correlation value of the values of the second pixels; and an interpolation processing unit that, when the correlation value is greater than a threshold based on a noise signal intensity in the values of the second pixels, interpolates a value of the first pixel that is based on the direction of the intensity distribution from the values of the second pixels and, otherwise, interpolates the value of the first pixel from the values of the second pixels without depending on the direction of the intensity distribution.

20 Claims, 18 Drawing Sheets

(56) References Cited

U.S. PATENT DOCUMENTS

2015/0237314 A1\* 8/2015 Hasegawa .............. H04N 9/045
  348/279
2016/0330414 A1   11/2016 Takado
2016/0344956 A1   11/2016 Takado
2017/0098296 A1\*  4/2017 Chong ................... H04N 9/045
2017/0296034 A1\* 10/2017 Sasaki ................ A61B 1/00009

\* cited by examiner

| $C_{11}$ | $W_{12}$ | $C_{13}$ | $W_{14}$ | $C_{15}$ |
|---|---|---|---|---|
| $W_{21}$ | $W_{22}$ | $W_{23}$ | $W_{24}$ | $W_{25}$ |
| $C_{31}$ | $W_{32}$ | $C_{33}$ | $W_{34}$ | $C_{35}$ |
| $W_{41}$ | $W_{42}$ | $W_{43}$ | $W_{44}$ | $W_{45}$ |
| $C_{51}$ | $W_{52}$ | $C_{53}$ | $W_{54}$ | $C_{55}$ |

FIG. 12B

| $C_{11}$ | $G_{12}$ | $C_{13}$ | $G_{14}$ | $C_{15}$ |
|---|---|---|---|---|
| $G_{21}$ | $G_{22}$ | $G_{23}$ | $G_{24}$ | $G_{25}$ |
| $C_{31}$ | $G_{32}$ | $C_{33}$ | $G_{34}$ | $C_{35}$ |
| $G_{41}$ | $G_{42}$ | $G_{43}$ | $G_{44}$ | $G_{45}$ |
| $C_{51}$ | $G_{52}$ | $C_{53}$ | $G_{54}$ | $C_{55}$ |

FIG. 12C

| $C_{11}$ | $Ye_{12}$ | $C_{13}$ | $Ye_{14}$ | $C_{15}$ |
|---|---|---|---|---|
| $Ye_{21}$ | $Ye_{22}$ | $Ye_{23}$ | $Ye_{24}$ | $Ye_{25}$ |
| $C_{31}$ | $Ye_{32}$ | $C_{33}$ | $Ye_{34}$ | $C_{35}$ |
| $Ye_{41}$ | $Ye_{42}$ | $Ye_{43}$ | $Ye_{44}$ | $Ye_{45}$ |
| $C_{51}$ | $Ye_{52}$ | $C_{53}$ | $Ye_{54}$ | $C_{55}$ |

FIG. 13A

|  | X=1 | 2 | 3 | 4 | 5 |
|---|---|---|---|---|---|
| Y=1 | R | W | G | W | R |
| 2 | W | W | W | W | W |
| 3 | G | W | B | W | G |
| 4 | W | W | W | W | W |
| 5 | R | W | G | W | R |

|  | X=1 | 2 | 3 | 4 | 5 |
|---|---|---|---|---|---|
| Y=1 | R | W | G | W | R |
| 2 | W | W | W | W | W |
| 3 | G | W | B | W | G |
| 4 | W | W | W | W | W |
| 5 | R | W | G | W | R |

FIG. 13C

|  | X=1 | 2 | 3 | 4 | 5 |
|---|---|---|---|---|---|
| Y=1 | R | W | G | W | R |
| 2 | W | W | W | W | W |
| 3 | G | W | B | W | G |
| 4 | W | W | W | W | W |
| 5 | R | W | G | W | R |

FIG. 13D

|  | X=1 | 2 | 3 | 4 | 5 |
|---|---|---|---|---|---|
| Y=1 | R | W | G | W | R |
| 2 | W | W | W | W | W |
| 3 | G | W | B | W | G |
| 4 | W | W | W | W | W |
| 5 | R | W | G | W | R |

FIG. 13E

|  | X=1 | 2 | 3 | 4 | 5 |
|---|---|---|---|---|---|
| Y=1 | R | W | G | W | R |
| 2 | W | W | W | W | W |
| 3 | G | W | B | W | G |
| 4 | W | W | W | W | W |
| 5 | R | W | G | W | R |

IMAGING DEVICE, IMAGING SYSTEM, AND IMAGE PROCESSING METHOD

BACKGROUND OF THE INVENTION

Field of the Invention

The present invention relates to an imaging device, an imaging system, and an image processing method.

Description of the Related Art

In imaging devices such as a CMOS image sensor, a CCD image sensor, or the like, color filters that transmit light of particular wavelengths are formed on a plurality of photoelectric conversion elements arranged in a two-dimensional manner. Various types of combined color filters are possible, and a combination of red (R), green (G), and blue (B), which are primary colors of the additive mixture of colors, and a combination of cyan (Cy), magenta (Mg), and yellow (Ye), which are primary colors of the subtractive mixture of colors, for example are known. Based on signals from pixels having these respective color filters (hereafter, referred to as color pixel), color image data is produced. For improvement of sensitivity of a solid state imaging device or improvement of signal-to-noise ratio (S/N ratio) in image data, there is known an arrangement with an increased ratio of pixels whose color is more likely to provide brightness information. For example, a solid state imaging device in which the ratios of G and Ye color pixels are increased or white (W or clear) pixels (hereafter, referred to as W pixel) which transmit a light of a wide range of visible light are further provided has been proposed. Further, with respect to the arrangement of filters of respective colors, various arrangements such as so-called Bayer arrangement that are suitable for generating color image data have been proposed.

Japanese Patent Application Laid-open No. 2011-91483 discloses a solid state imaging device that has a so-called RGBW arrangement made of R, G, and B color pixels and white pixels and an image processing device that interpolates and generates RGB color image data based on output signals of respective pixels. In Japanese Patent Application Laid-open No. 2011-91483, the device detects an edge direction from the gradient of pixel values of a plurality of W pixels located around a color pixel to be interpolated and performs an interpolation process on a pixel value corresponding to a W pixel in the color pixels based on the edge direction.

In the technique disclosed in Japanese Patent Application Laid-open No. 2011-91483, however, a larger noise signal superimposed on an image may cause a false detection of the edge direction and therefore a pixel value cannot be accurately interpolated. As a result, a false pattern is generated causing a reduction in an image quality.

SUMMARY OF THE INVENTION

An imaging device according to one aspect of the present invention has: a pixel unit in which a first pixel and a plurality of second pixels are arranged in a matrix, wherein the plurality of second pixels are arranged around the first pixel, and each of the plurality of second pixels can provide more brightness information than is provided by the first pixel; a directional property determination unit that determines a direction of an intensity distribution based on differences among values of the plurality of second pixels; a correlation value calculation unit that calculates a correlation value of the values of the plurality of second pixels; and an interpolation processing unit that, when the correlation value is greater than a threshold that is based on a noise signal intensity in the values of the plurality of second pixels, interpolates a value of the first pixel based on the direction of the intensity distribution from the values of the plurality of second pixels and, when the correlation value is less than or equal to the threshold, interpolates the value of the first pixel from the values of the plurality of second pixels without depending on the direction of the intensity distribution.

An image processing method according to another aspect of the present invention is an image processing method for processing a signal output from a pixel unit including a first pixel and a plurality of second pixels, wherein the plurality of second pixels are arranged around the first pixel, and each of the plurality of second pixels can provide more brightness information than is provided by the first pixel. The method has: determining a direction of an intensity distribution based on differences among values of the plurality of second pixels; calculating a correlation value of the values of the plurality of second pixels; and when the correlation value is greater than a threshold that is based on a noise signal intensity in the values of the plurality of second pixels, interpolating a value of the first pixel based on the direction of the intensity distribution from the values of the plurality of second pixels and, when the correlation value is less than or equal to the threshold, interpolating the value of the first pixel from the values of the plurality of second pixels without depending on the direction of the intensity distribution.

Further features of the present invention will become apparent from the following description of exemplary embodiments with reference to the attached drawings.

BRIEF DESCRIPTION OF THE DRAWINGS

FIG. 7A, FIG. 7B, FIG. 7C, FIG. 7D, and FIG. 7E are diagrams illustrating a directional property determination process in the first embodiment.

FIG. 8A, FIG. 8B, and FIG. 8C are diagrams of an example of a result of an interpolation process in the first embodiment.

FIG. 12A, FIG. 12B, and FIG. 12C are diagrams of pixel arrangements of an imaging device according to the third embodiment.

FIG. 13A, FIG. 13B, FIG. 13C, FIG. 13D, and FIG. 13E are diagrams illustrating a directional property determination process in a fourth embodiment.

DESCRIPTION OF THE EMBODIMENTS

Preferred embodiments of the present invention will now be described in detail in accordance with the accompanying drawings.

Imaging devices of respective embodiments will be described below with reference to the drawings.

First Embodiment

Figure 1:
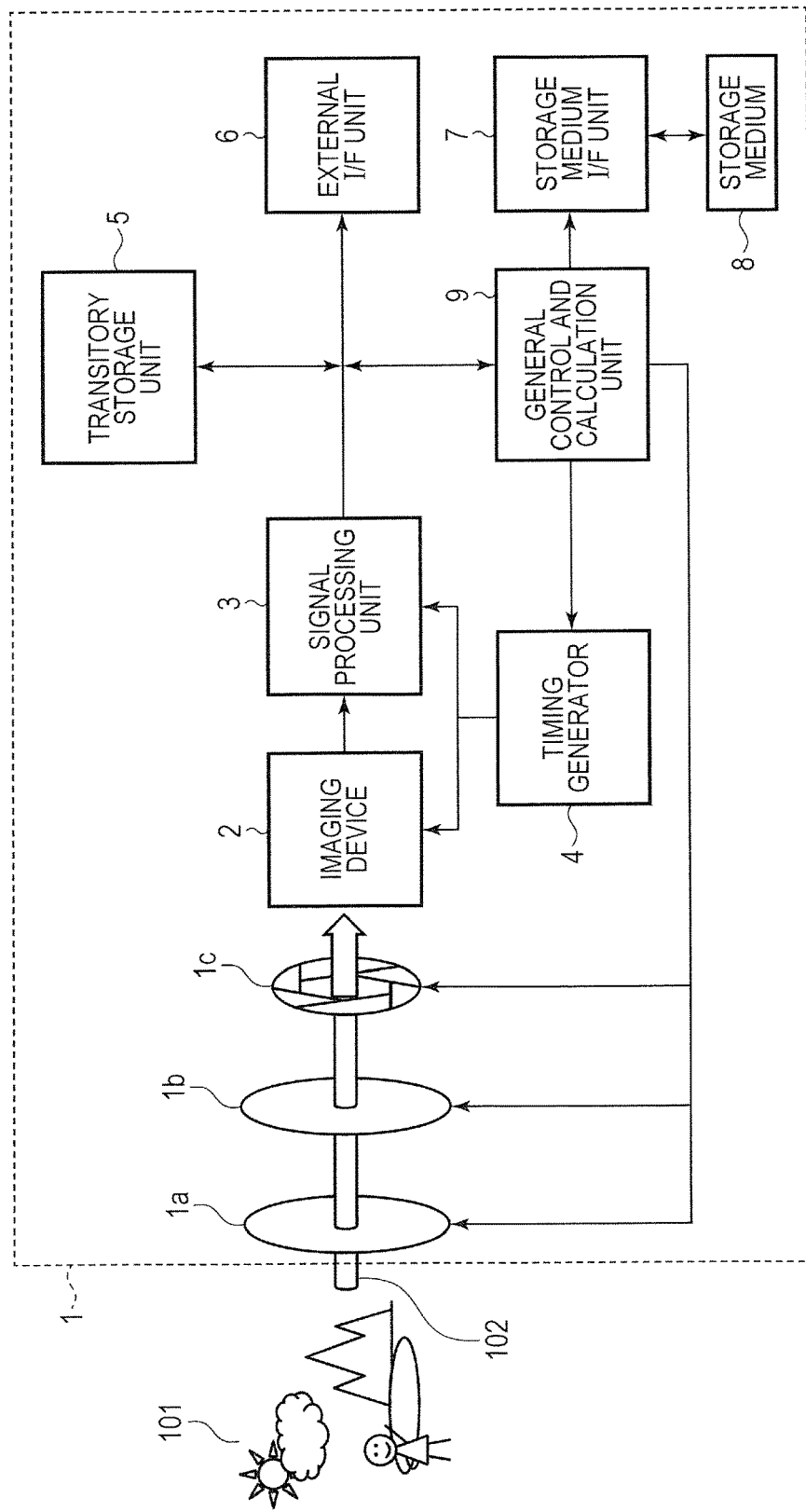
FIG. 1 is a block diagram of an imaging system according to a first embodiment.

FIG. 1 is a block diagram of an imaging system according to the present embodiment. The imaging system is an apparatus that acquires a static image, a motion image, or the like by using an imaging device and may include a digital still camera, a digital camcorder, a surveillance camera, a smartphone, or the like, for example. The imaging system 1 has a barrier 1a, a lens 1b, an aperture 1c, an imaging device 2, a signal processing unit 3, a timing generator 4, a transitory storage unit 5, an external I/F unit 6, a storage medium I/F unit 7, a storage medium 8, and a general control and calculation unit 9. The imaging device 2 is a solid state imaging device such as a CCD image sensor, a CMOS image sensor, or the like and converts an optical image 102 originated from a subject 101 into an electrical signal and outputs it to the signal processing unit 3 in the post-stage. The lens 1b captures the optical image 102 of the subject 101 on the imaging device 2. The aperture 1c adjusts the light amount of the optical image 102 captured on the imaging device 2 via the lens 1b. The barrier 1a that protects the lens 1b is arranged as necessity.

The signal processing unit 3 has a digital signal processing unit and performs various correction, compression, or the like on a signal output from the imaging device 2 to output image data. When a signal output from the imaging device 2 is an analog signal, the signal processing unit 3 may have an analog-to-digital conversion (A/D conversion) circuit in the pre-stage of the digital signal processing unit. Note that the signal processing unit 3 may be provided in the imaging device 2 or may be provided in a computer outside the imaging system 1.

The timing generator 4 outputs a timing signal such as a clock signal, a synchronous signal, or the like to the imaging device 2, the signal processing unit 3, and the like. Note that a timing signal may be supplied from the outside of the imaging system 1. The transitory storage unit 5 is a buffer memory for temporarily storing image data therein. The external interface (I/F) unit 6 is a circuit for communicating with an external computer, an image processing device, a network, or the like. The storage medium I/F unit 7 is an interface for performing recording or readout to/from the storage medium 8. The storage medium 8 is a semiconductor memory, an optical magnetic medium, or the like and may be removable from or built in the imaging system 1. The general control and calculation unit 9 controls the entire imaging system 1.

Figure 2:
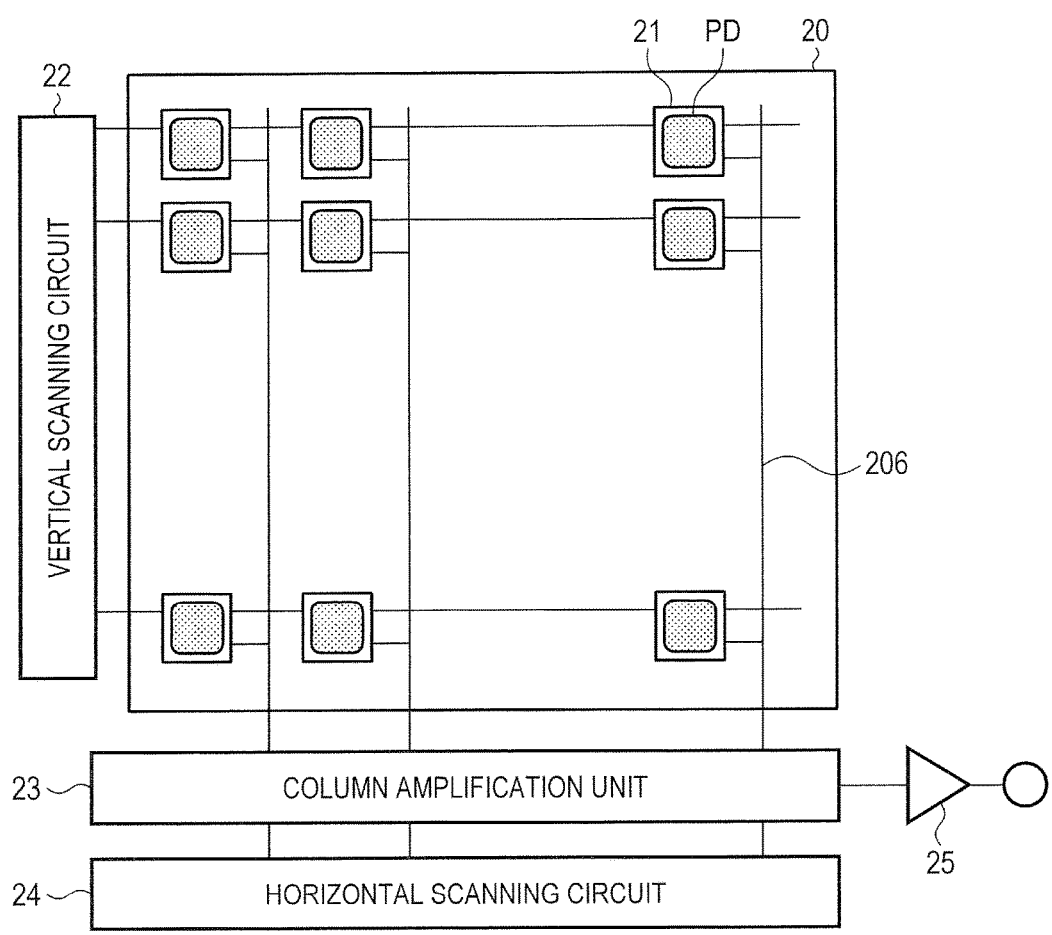
FIG. 2 is a block diagram of an imaging device according to the first embodiment.

FIG. 2 is a block diagram of the imaging device 2 according to the present embodiment. The imaging device 2 has a pixel unit 20 in which a plurality of pixels 21 are arranged in a matrix, a vertical scanning circuit 22, a column amplification unit 23, a horizontal scanning circuit 24, and an output unit 25. The pixel unit 20 has a plurality of pixels 21 arranged in a matrix, and each of the pixels 21 has a photoelectric conversion element PD. The photoelectric conversion element PD generates charges in accordance with an irradiated light, and the pixel 21 outputs a voltage based on the charges. The vertical scanning circuit 22 supplies control signals for controlling transistors of each pixel 21 to a conductive state (on-state) or a non-conductive state (off-state). The pixel unit 20 has vertical signal lines 206 for reading out pixel signals from the pixels 21. Pixel signals transferred to the vertical signal lines 206 from the pixels 21 are read out on a pixel column basis. The horizontal scanning circuit 24 has switches each connected to an amplifier on each pixel column and supplies control signals for controlling each switch to an on-state or an off-state. The output unit 25 is formed of a buffer amplifier, a differential amplifier, and the like and outputs a pixel signal from the column amplification unit to the signal processing unit 3 that is outside the imaging device 2. The output pixel signal is subjected to processes such as analog-to-digital conversion, input data correction, or the like by the signal processing unit 3. Note that the imaging device 2 may have a function of analog-to-digital conversion.

Figure 3:
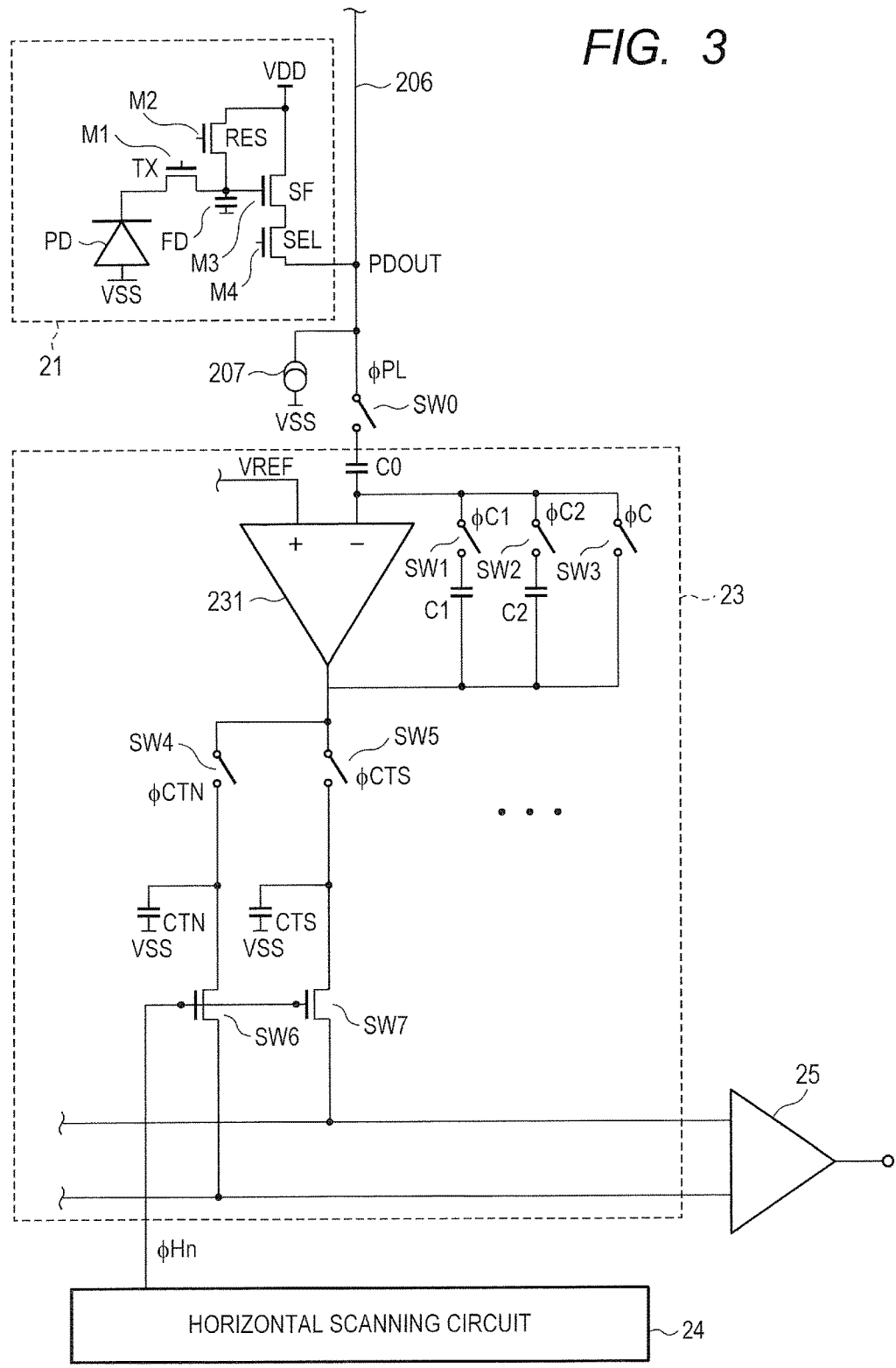
FIG. 3 is a circuit diagram of a pixel and a column amplification unit of the imaging device according to the first embodiment.

FIG. 3 is a circuit diagram of the pixel 21 and the column amplification unit 23 of the imaging device 2 according to the present embodiment. For easier illustration here, a circuit for one column of the column amplification unit 23 and one pixel 21 are depicted in FIG. 3. The pixel 21 has the photoelectric conversion element PD, a floating diffusion capacitor FD, a transfer transistor M1, a reset transistor M2, an amplification transistor M3, and a selection transistor M4. Note that the pixel 21 may have a configuration such that a plurality of photoelectric conversion elements PD share the floating diffusion capacitor FD, the reset transistor M2, the amplification transistor M3, and the selection transistor M4. Further, each of the transistors M2 to M4 is not limited to an N-channel MOS transistor and may be formed of a P-channel MOS transistor.

The photoelectric conversion element PD is formed of a photodiode or the like and photoelectrically converts an irradiated light into electrons (charges). A signal TX is supplied to the gate of the transfer transistor M1 and, in response to the signal TX being turned to a high level, the transfer transistor M1 transfers charges generated in the photoelectric conversion element PD to the floating diffusion capacitor FD. The floating diffusion capacitor FD serves also as the drain terminal of the transfer transistor M1 and is able to hold charges transferred from the photoelectric conversion element PD via the transfer transistor M1. A signal RES is supplied to the gate of the reset transistor M2 and, in response to the signal RES being turned to a high level, the reset transistor M2 resets the voltage of the floating diffusion capacitor FD to a reset voltage VDD. Electrons of the photoelectric conversion element PD are reset by simultaneously turning on the transfer transistor M1 and the reset transistor M2. The gate of the amplification transistor M3 is connected to the floating diffusion capacitor FD.

The source of the amplification transistor M3 is electrically connected via the selection transistor M4 to a node PDOUT of the vertical signal line 206 common to each column and forms a source follower. A signal SEL is applied to the gate of the selection transistor M4 and, in response to the signal SEL being turned to a high level, the vertical signal line 206 and the amplification transistor M3 are electrically connected. Thereby, a pixel signal is read out from the selected pixel 21.

The signal TX, the signal RES, and the signal SEL supplied to the pixel 21 are output from the vertical scanning circuit 22. The vertical scanning circuit 22 control the levels of these signals to scan the pixels 21 on a row basis. A current source 207 supplies a current to a pixel 21 via the vertical signal line 206, and the vertical signal line 206 is connected to the column amplification unit 23 via a switch SW0 driven by a signal PL.

The column amplification unit 23 has a column amplifier 231, an input capacitor C0, feedback capacitors C1 and C2, switches SW1 to SW7, and capacitors CTN and CTS. The column amplifier 231 is formed of a differential amplifier circuit having an inverting input node, a non-inverting input node, and an output node. The inverting input node of the column amplifier 231 is electrically connected to the vertical signal line 206 via the switch SW0 and the input capacitor C0, and a reference voltage VREF is applied to the non-inverting input node. The inverting input node and the output node are connected to each other via three feedback circuits connected in parallel. The first feedback circuit is formed of the switch SW1 and the feedback capacitor C1 connected in series, the second feedback circuit is formed of the switch SW2 and the feedback capacitor C2 connected in series, and the third feedback circuit is formed of the switch SW3. The amplification factor of the column amplifier 231 can be changed by properly controlling turning on and off of the switches SW1 to SW3. That is, the amplification factor is C0/C1 when the switch SW1 only is turned on, and the amplification factor is C0/C2 when the switch SW2 only is turned on. Further, the amplification factor is C0/(C1+C2) when the switches SW1 and SW2 are turned on, and the column amplifier 231 operates as a voltage follower when the switches SW3 only is turned on. The switches SW1 to SW3 are controlled by the signals φC, φC1 to φC2, respectively.

The output node of the column amplifier 231 is connected to the capacitor CTN via the switch SW4 controlled by the signal φCTN. In a similar manner, the output node of the column amplifier 231 is connected to the capacitor CTS via the switch SW5 controlled by the signal φCTS. At resetting of the floating diffusion capacitor FD, the switch SW4 is turned on and switch SW5 is turned off, and a pixel signal (N signal) at the resetting is sampled and held in the capacitor CTN. After photoelectrically converted charges are transferred to the floating diffusion capacitor FD, the switch SW4 is turned off and switch SW5 is turned on, and a pixel signal (S signal) based on the photoelectrically converted charges is sampled and held in the capacitor CTS.

The capacitor CTN is connected to a first input node of the output unit 25 via the switch SW6, and the capacitor CTS is connected to a second input node of the output unit 25 via the switch SW7. The horizontal scanning circuit 24 sequentially turns signals φHn to a high level on each column and thereby a horizontal scan is performed. That is, in response to the signal φHn being high level, the switch SW6 outputs the N signal held in the capacitor CTN to the first input node of the output unit 25, and the switch SW7 outputs the S signal held in the capacitor CTS to the second input node of the output unit 25.

The output unit 25 is formed of a differential amplifier circuit, which amplifies and outputs the difference of the input S signal and N signal to output a pixel signal in which a noise component at resetting has been removed. Note that a double correlation sampling may be performed after analog-to-digital conversion of the N signal and the S signal.

FIG. 4A to FIG. 4C and FIG. 5A to FIG. 5D represent plan views of various imaging devices 2 that are applicable to the present embodiment. On each pixel, the imaging device 2 with a single plate has a color filter for producing a color image. The color filters are arranged in the side on which a light from a subject enters the photoelectric conversion elements PD. Pixel signals representing color intensities are output from the pixels 21, and a color image is produced based on the pixel signals. In the present embodiment, the imaging device 2 having various color filters as illustrated below are applicable.

Figure 4A:
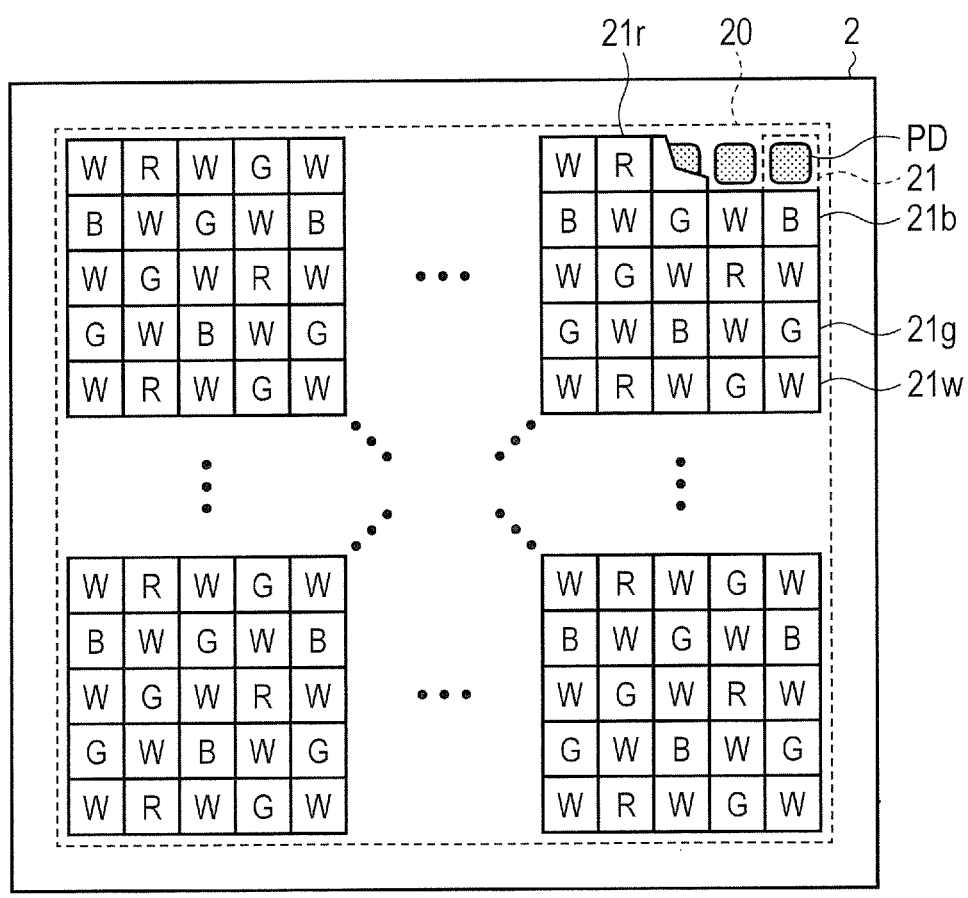
FIG. 4A, FIG. 4B, and FIG. 4C are diagrams of the imaging devices having color filters of the additive mixture of colors in the first embodiment.
Figure 4B:
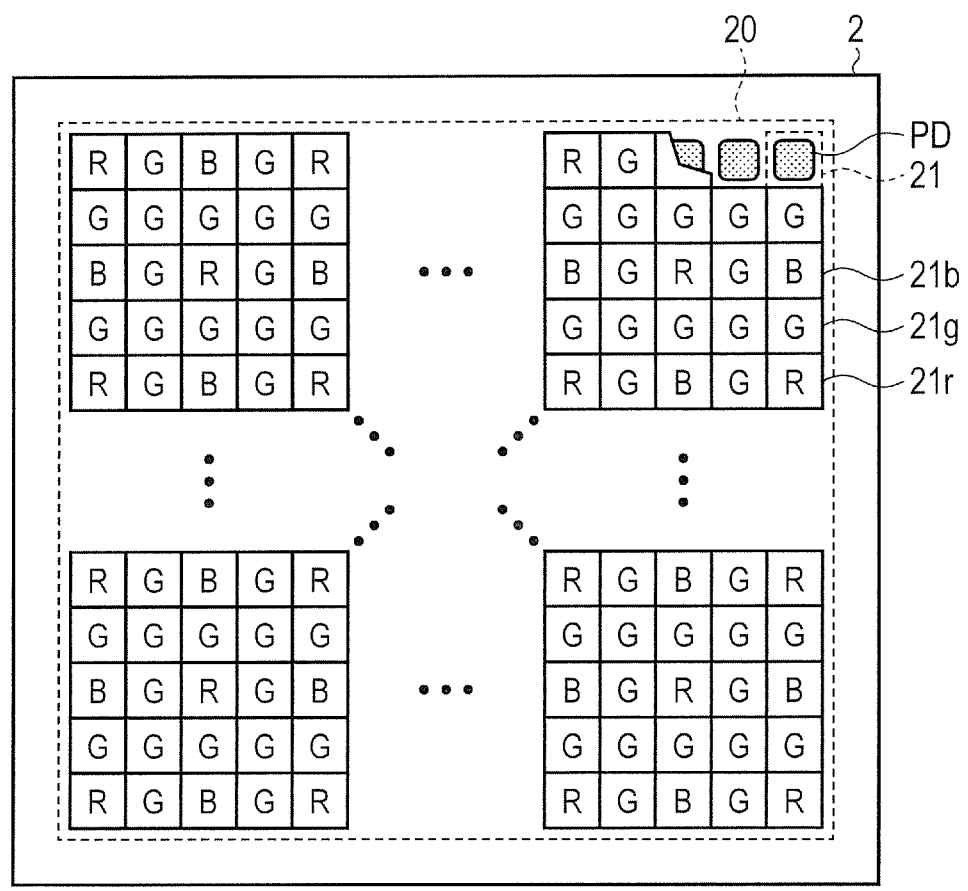
Figure 4C:
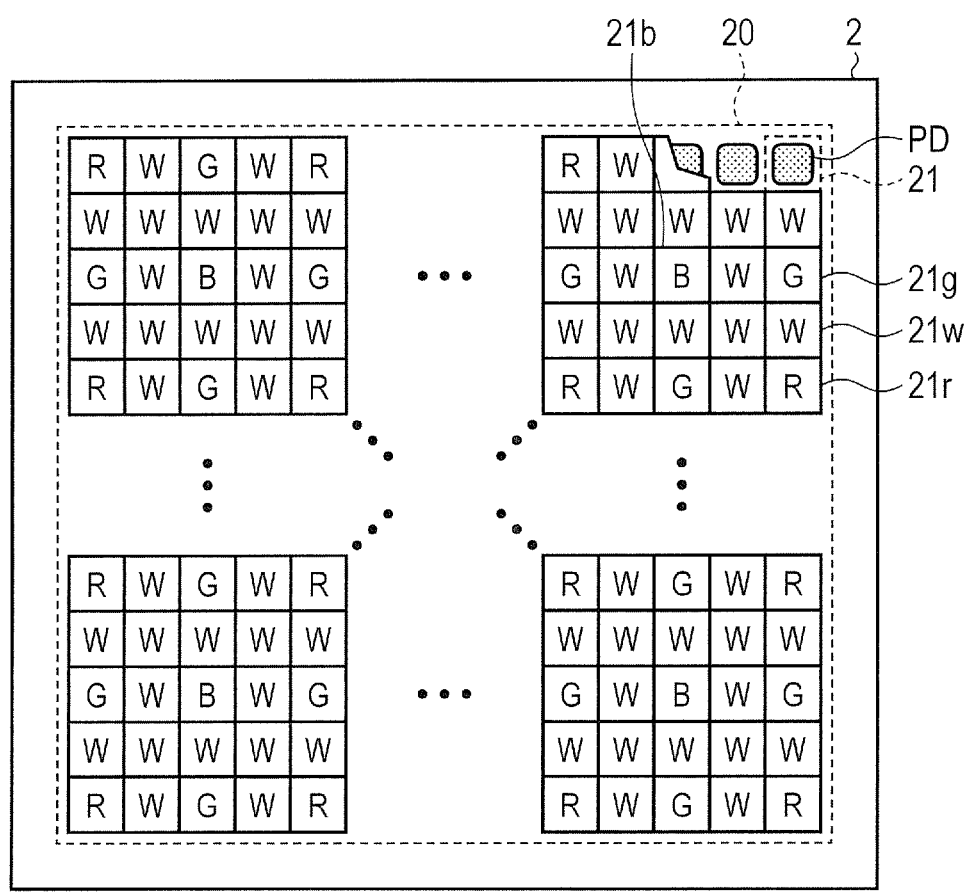

FIG. 4A to FIG. 4C illustrate the imaging devices 2 having color filters of the additive mixture of colors. The imaging device 2 of FIG. 4A has R pixels each having a color filter 21r, G pixels each having a color filter 21g, B pixels each having a color filter 21b, and W pixels each having a clear filter 21w. Red pixels (R pixels), green pixels (G pixels), blue pixels (B pixels), and white pixels (W pixels) are arranged according to the Bayer arrangement, and W pixels (second pixels) are arranged in four directions of each of the color pixels of R pixels, G pixels, and B pixels (first pixels). The imaging device 2 of FIG. 4B has R pixels, G pixels, and B pixels, and eight G pixels (second pixels) are arranged around each of the color pixels of R pixels and B pixels (first pixels). The imaging device 2 of FIG. 4C has R pixels, G pixels, B pixels, and W pixels, and eight W pixels (second pixels) are arranged around each of color pixels of R pixels, G pixels, and B pixels (first pixels). In 16 pixels of four by four pixels, respective pixels are arranged with a ratio R:G:B:W=1:2:1:12, and this arrangement is called an RGBW12 arrangement. In the RGBW12 arrangement, each of R pixels, G pixels, and B pixels, which are color pixels, is surrounded by eight W pixels, and the ratio of W pixels is three-fourths the entire pixels. That is, the RGBW12 arrangement has W pixels as a second pixel group and has color pixels (RGB pixels) as a first pixel group. The total number of pixels of the second pixel group is three or more times (greater than two times) the total number of pixels of the first pixel group, and the second pixel group has more resolution information than that of the first pixel group.

FIG. 5A to FIG. 5D illustrate the imaging devices 2 having color filters of the subtractive mixture of colors. The imaging device 2 of FIG. 5A has cyan pixels (Cy pixels) each having a color filter 21cy, magenta pixels (Mg pixels) each having a color filter 21mg, yellow pixels (Ye pixels) each having a color filter 21ye, and white pixels (W pixels) each having a clear filter 21w. Cy pixels, Mg pixels, Ye pixels, and W pixels are arranged according to the Bayer arrangement, and W pixels (second pixels) are arranged in four directions of each of the color pixels of Cy pixels, Mg pixels, and Ye pixels (first pixels). The imaging device 2 of FIG. 5B has Cy pixels, Mg pixels, and Ye pixels, and Ye pixels (second pixels) are arranged in four directions of each of color pixels of Cy pixels and Mg pixels (first pixels). The imaging device 2 of FIG. 5C has Cy pixels, Mg pixels, Ye pixels, G pixels, and W pixels. Eight W pixels are arranged around each of color pixels of Cy pixels, Mg pixels, and Ye pixels (first pixels). The imaging device 2 of FIG. 5D has Cy pixels, Mg pixels, Ye pixels, and W pixels, and eight W pixels (second pixels) are arranged around each of the color pixels of Cy pixels, Mg pixels, and Ye pixels (first pixels).

In any of the imaging devices 2 of FIG. 4A to FIG. 4C and FIG. 5A to FIG. 5D, the second pixels by which more brightness information can be obtained than is obtained by the first pixels are arranged around each of the first pixels. In particular, when W pixels are used for the second pixels, the W pixels have a spectral sensitivity characteristic whose full width half maximum is wider than that of G pixels and Ye pixels and therefore, with W pixels being arranged around a color pixel, more brightness information can be obtained. For example, the imaging device 2 of FIG. 4A has W pixels in addition to the primary colors (R, G, and B) of the additive mixture of colors, and the imaging device 2 of FIG. 5A has W pixels in addition to the primary colors (Mg, Cy, and Ye) of the subtractive mixture of colors. These imaging devices 2 allows for a higher sensitivity than an imaging device having the Bayer arrangement. Further, in addition to the visible wavelength range, W pixels can have a sensitivity in a wavelength range which may be sensed by the photoelectric conversion element PD. Note that, in addition to effective pixels, the imaging device 2 may include pixels which do not output any image, such as an optical-black pixel, a dummy pixels having no photoelectric conversion unit, or the like. However, these optical-black pixel and dummy pixel are not included in the first pixels or the second pixels.

Figure 5A:
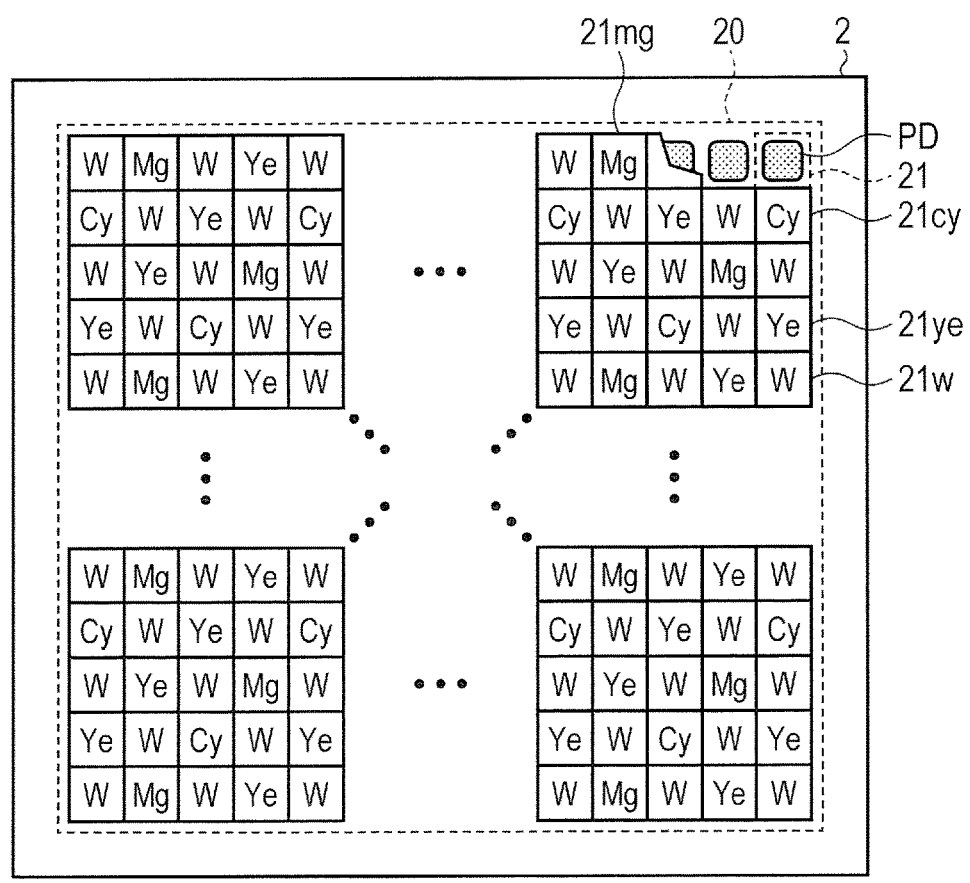
FIG. 5A, FIG. 5B, FIG. 5C, and FIG. 5D are diagrams of the imaging devices having color filters of the subtractive mixture of colors in the first embodiment.
Figure 5B:
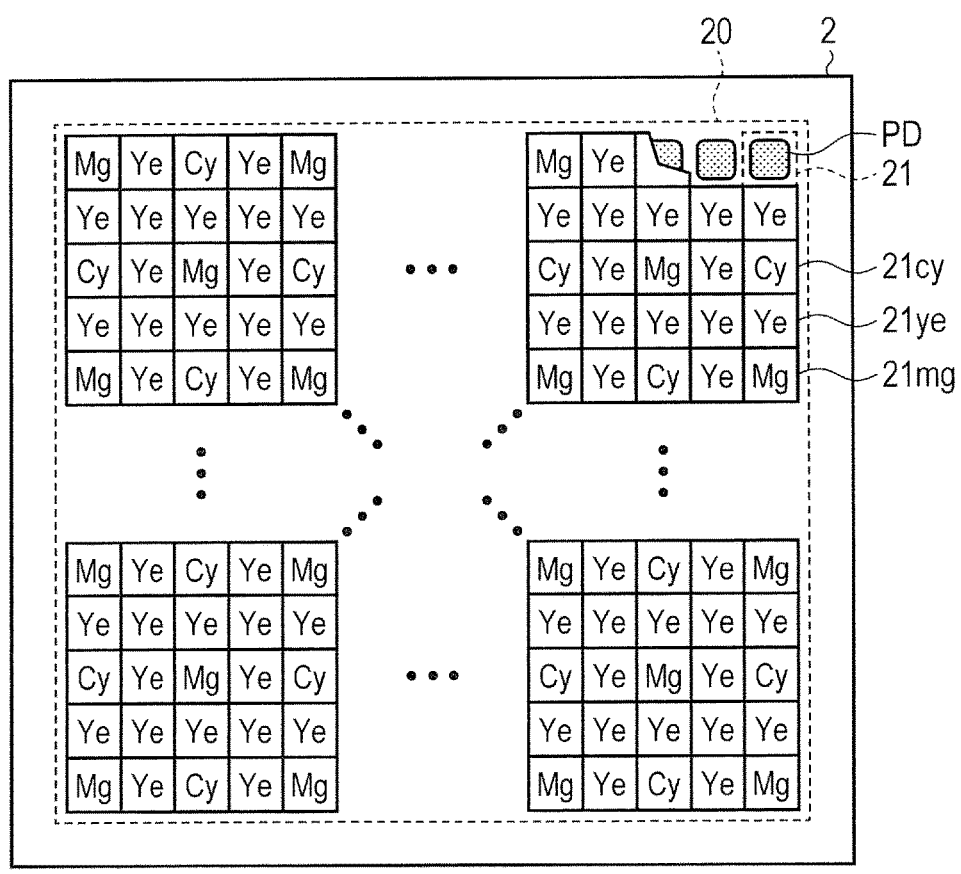
Figure 5C:
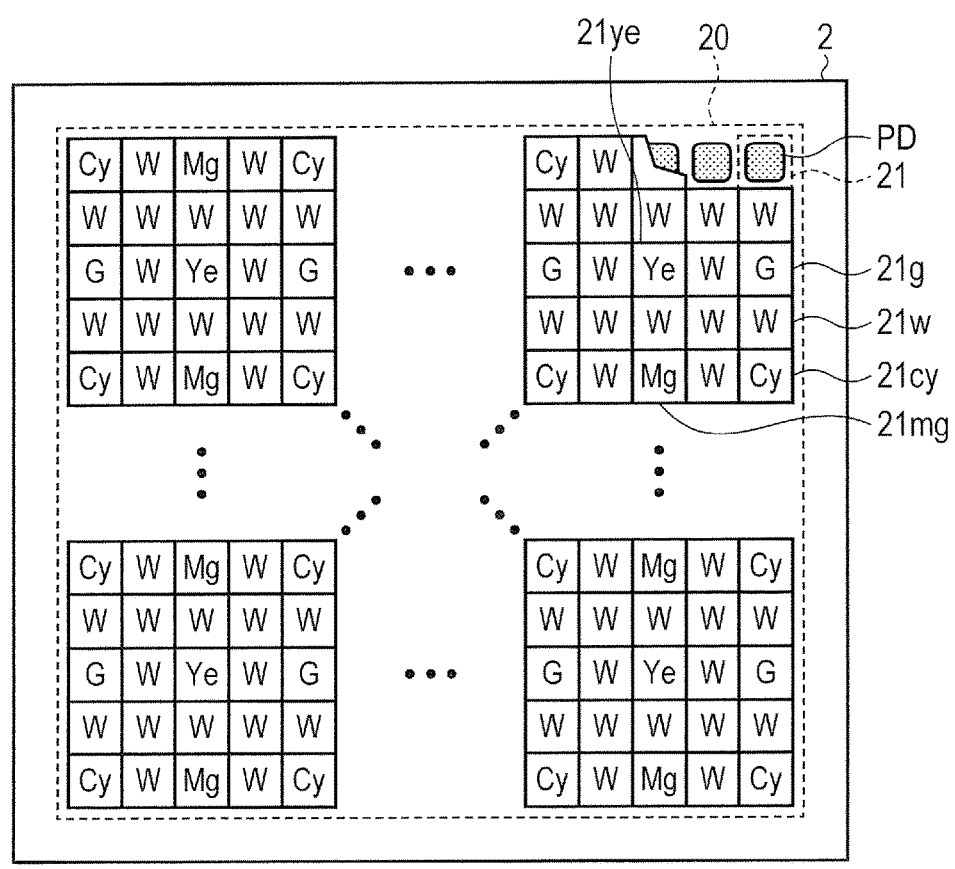
Figure 5D:
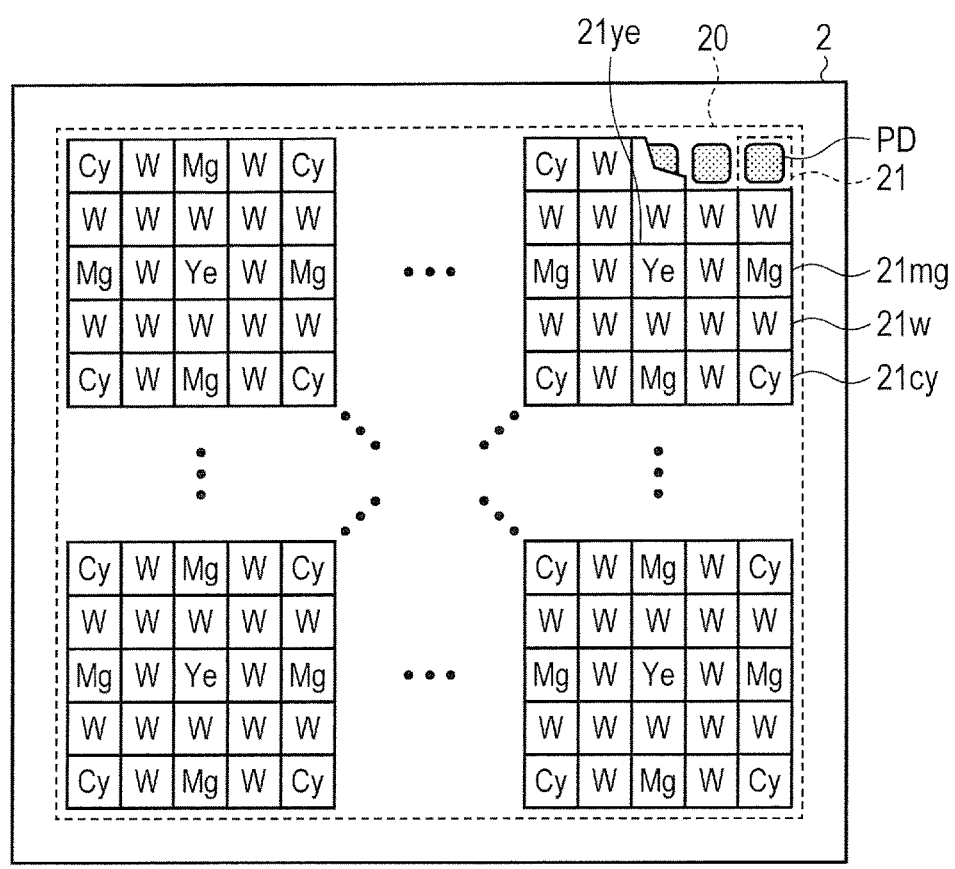

The imaging devices 2 illustrated in FIG. 4B and FIG. 5B include many pixels of colors having a high sensitivity to brightness among pixels with the primary colors of the additive and subtractive mixture of colors and therefore can provide more brightness information. In the imaging devices 2 of the FIG. 4C, FIG. 5C, and FIG. 5D, the ratio of the number of color pixels to the number of W pixels is 1:3. Thus, the imaging device 2 having a higher sensitivity to brightness and exhibiting a higher resolution can be realized.

Since all of the imaging devices 2 described above are of a single plate type, a signal with a particular color component (information) is output from each pixel. Thus, a high definition color image is produced by using an interpolation process to generate signals of other color components. For example, although an R pixel has no information of G and B, the pixel values of G and B at the position of an R pixel can be estimated based on the values of G pixels and B pixels located near the R pixel. In FIG. 4B, FIG. 4C, FIG. 5B, FIG. 5C, and FIG. 5D, G pixels, Ye pixels or W pixels are arranged around each color pixel. G pixels, Ye pixels, and W pixels may have higher sensitivity to brightness than other color pixels and therefore have sharp perception to brightness. Thus, a use of the values of G pixels, Ye pixels, or W pixels around a color pixel facilitates estimation of brightness information of G, Ye, or W at the position of the color pixel. Further, with pixels such as W pixels, which are sensitive to brightness, being arranged around each of the color pixels, the intensity value at a position of a color pixel can be interpolated at a high accuracy.

Figure 6:
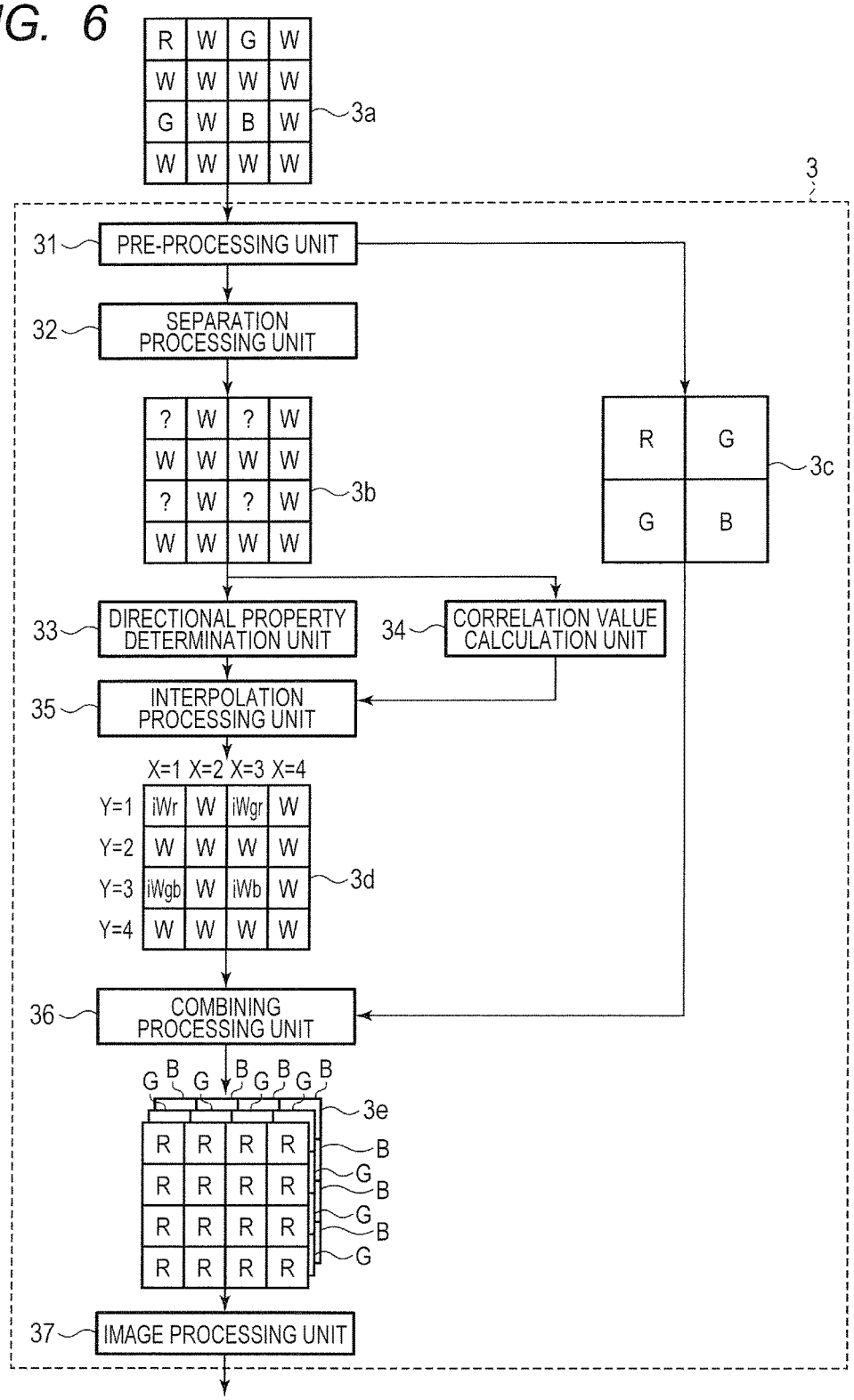
FIG. 6 is a block diagram of a signal processing unit in the first embodiment.

FIG. 6 is a block diagram of the signal processing unit 3 in the present embodiment. The signal processing unit 3 has a digital signal processor circuit that processes image data, a volatile memory that temporarily holds image data before and after a process, a non-volatile memory that records program data therein, a hardware logic circuit, a data input/output circuit, a bus control circuit, a clock circuit, and a power management circuit. Each circuit of the signal processing unit 3 can be divided into a pre-processing unit 31, a separation processing unit 32, a directional property determination unit 33, a correlation value calculation unit 34, an interpolation processing unit 35, a combining processing unit 36, and an image processing unit 37. A pixel signal from the imaging device 2 is input to the pre-processing unit 31. Although the imaging device 2 will be described as having the RGBW12 arrangement, other pixel arrangements may be used. The pre-processing unit 31 performs various correction including offset correction, gain correction, or the like of a pixel signal. When a pixel signal output from the imaging device 2 is an analog signal, A/D conversion may be performed in the pre-processing unit 31.

The pre-processing unit 31 properly performs correction such as offset correction, gain correction, or the like of an input pixel signal Din and generates a corrected output Dout. This process can be typically expressed by the following equation.

$$D_{out} = (D_{in} - OFFSET) \cdot GAIN$$

This correction can be performed on a various circuit basis. For example, correction may be performed on a pixel basis and may be further performed on each column amplifier, on each circuit of an analog-to-digital conversion unit (ADC) or an output amplifier, or the like. Performing correction can reduce a so-called fixed pattern noise, and therefore image data 3a of a higher quality can be obtained. The image data 3a is held in the transitory storage unit 5 or a buffer memory of the signal processing unit 3. Further, a gain value X of the image data 3a is also saved together with an aperture value, a shutter speed, and a distance value.

The separation processing unit 32 separates the image data 3a into image data (brightness signal) 3b for brightness information and RGB image data (color signal) 3c for color information. Because the values of pixels indicated by "?" in the image data 3b are unknown, the values of these pixels are calculated through an interpolation process described later. Note that, in the following description, a pixel on which an interpolation process is performed is referred to as target pixel.

The directional property determination unit 33 calculates differences (correlations) between respective pixel values of the image data 3b and determines the directional property of an intensity distribution in the image data 3b based on these differences. For example, the directional property such as an edge of a subject can be determined by comparing differences in a vertical direction, a horizontal direction, and an oblique direction in W pixels around a target pixel. The difference may be divided by the distance between the centroids of the pixels, or the directional property may be determined based on presence or absence of an edge of a subject or presence or absence of an isolated point. Further, the directional property may be determined by calculating the dispersion of pixel values.

The correlation value calculation unit 34 calculates a correlation value of values of a plurality of W pixels in the image data 3b. For example, the correlation value may be calculated based on an intensity just noticeable difference with respect to the dispersion, the absolute values of differences, or the average value of the values of a plurality of W pixels located around a target pixel.

When a correlation value of pixel values of the image data 3b is greater than a threshold that is based on a noise signal intensity, the interpolation processing unit 35 interpolates a pixel value of a target pixel based on a plurality of W pixels located in a direction with a smaller difference of the pixel values. For example, when an R pixel is a target pixel and interpolated with a W signal, two W pixel values whose difference is small are referred to calculate an interpolation value. An intensity distribution such as an edge of a subject is estimated based on a difference, which allows accurate interpolation to be performed. In the above case, a W pixel value at an R pixel can be accurately interpolated, compared to a case where W pixel values having a difference therebetween is large are referred.

When the correlation value of the intensity is less than or equal to the threshold that is based on the noise signal intensity, the interpolation processing unit 35 interpolates a value of a target pixel based on pixel values which do not depend on a direction. For example, the value of a W pixel at coordinates (3, 3) in the image data 3b can be interpolated with the average value of eight pixels around the target pixel.

$$iWb_{(3,3)} = \frac{W_{(2,2)} + W_{(3,2)} + W_{(4,2)} + W_{(2,3)} + W_{(4,3)} + W_{(2,4)} + W_{(3,4)} + W_{(4,4)}}{8}$$

According to the present embodiment, by determining whether a change (intensity variation) in the values of W pixels is due to a subject or a noise, generation of a false pattern which would otherwise be caused by erroneous determination of the directional property can be avoided.

A process in which a signal of a pixel whose signal value is unknown is interpolated from signal values of surrounding pixels is performed. Note that, although four-by-four-pixel group is depicted, this pattern is repeated and therefore iWr, iWg, or the like can be interpolated from information of surrounding eight pixels. In FIG. 6, the values of W pixels generated by interpolation are denoted as iWr, iWb, iWgr, and iWgb.

The combining processing unit 36 generates R data, G data, and B data based on the interpolated W image data 3d and color image data 3c. Various methods can be used to generate R data, G data, and B data. For example, the color image data 3c may be normalized and R data, G data, and B data may be generated from the ratio of colors. In this method, the ratio of colors is calculated by the following equation:

$$\text{RGB\_ratio} = \left[ \frac{R}{R+G+B} \quad \frac{G}{R+G+B} \quad \frac{B}{R+G+B} \right]$$

where G=(Gr+Gb)/2.

Further, the ratio between the color image data 3c and the interpolated values iWr, iWg, and iWb may be calculated. In this case, the ratio of colors is calculated by the following equation.

$$\text{RGB\_ratio} = \left[ \frac{R}{iWr} \quad \frac{Gr+Gb}{iWgr+iWgb} \quad \frac{B}{iWb} \right]$$

Respective values of R, G, and B in each pixel can be calculated as follows by using a color ratio RGB_ratio and signals of W pixel values or the interpolated values iWr, iWgr, iWgb, and iWb. In such a way, R data, G data, and B data each having 16 pixels of four by four pixels are obtained.

$$RGB = [R\_ratio \cdot W \quad G\_ratio \cdot W \quad B\_ratio \cdot W]$$

In the above equation, R_ratio, G_ratio, and B_ratio represent respective color ratios of the RGB_ratio.

$$RGB\_ratio = [R\_ratio \quad G\_ratio \quad B\_ratio]$$

The image processing unit 37 performs a white balance process, a gamma process, a noise reduction process, or the like on R data, G data, and B data. Further, R data, G data, and B data may be converted to data whose horizontal and vertical resolutions are doubled, for example, by using an up-convert process, and then an image processing may be performed. As a technique of an up-convert process, a nearest neighbor method, a bilinear method, a bicubic method, or the like can be used. A pixelization may be performed after an up-convert process, and a use of a nearest neighbor method can prevent accumulation of data processing errors.

Note that multiple frames of W image data and multiple frames of color image data may be averaged. Further, N frames (N is greater than or equal to one) of W image data are averaged, and M frames, which are more than N frames, of color image data may be averaged. In this case, an image with a reduced color noise can be produced while suppressing a reduction in the resolution. Further, a change (correlation) between frames of W data may be determined and the number of frames (weighting) of an inter-frame process may be changed based on the determination result. For example, when it is detected that a dynamic body is included in a subject, an interpolation process may be performed by using a single frame of W image data and multiple frames of color image data without averaging the W data. In this case, an image with a reduced color noise can be obtained while suppressing blur of a subject. Further, when it is detected that no dynamic body is included in a subject, the image processing unit 37 produces an image by averaging W image data and color image data on multiple frames basis, respectively. On the other hand, when it is detected that a dynamic body is included in a subject, the image processing unit 37 may produce an image from the W image data and the color image data of each frame. This can suppress a color noise such as a color residual image of a highly dynamic subject.

FIG. 7A to FIG. 7E are diagrams illustrating a directional property determination process in the present embodiment, which illustrate a calculation determination process of a correlation value (directional property) in the RGBW12 arrangement. In FIG. 7B to FIG. 7E, arrows indicate two W pixels used for calculation of a correlation value in five by five pixels of eight by eight pixels of FIG. 7A. Further, a B pixel at coordinates (3, 3) is a target pixel. The directional property determination unit 33 weights and adds absolute values of differences of W pixel values in the W pixels around the target pixel to calculate correlation values. A coefficient of weighting can be defined in accordance with the distance from a position between a pair of two W pixels to the B pixel. For example, the shorter the distance between the W pixel and the B pixel is, the larger the weighting coefficient may be. The distance between pixels can be defined here as the distance from the centroid of one pixel to the centroid of the other pixel. Further, the centroid of a pixel can be defined as the centroid of a micro lens or the centroid of the photoelectric conversion element PD.

Figures 7A, 7B, 7C, 7D, 7E:
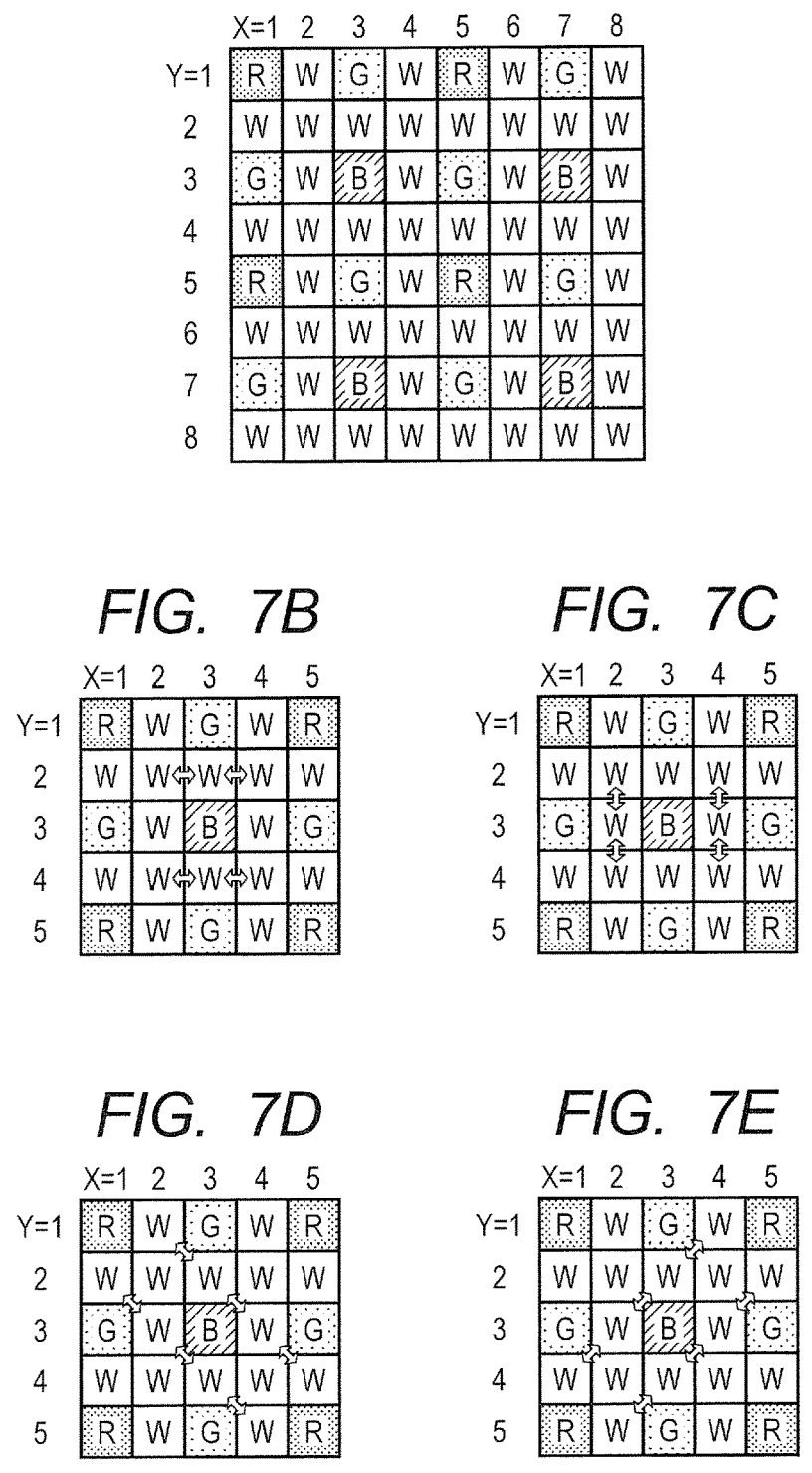

In FIG. 7B, arrows indicate pixels used for a differential summation in the horizontal direction. The directional property determination unit 33 can calculate a differential sum in the horizontal direction by adding absolute values of differences of respective two neighboring-pixel values. Since pairs of the W pixels indicated by arrows are located in the same distance from the B pixel, all the weighting coefficients are the same.

$$\text{Differential sum (horizontal)} = |W(2, 2) - W(3, 2)| \times 2 +$$
$$|W(3, 2) - W(4, 2)| \times 2 + |W(2, 4) - W(3, 4)| \times 2 + |W(3, 4) - W(4, 4)| \times 2$$

In FIG. 7C, arrows indicate pixels used for a differential summation in the vertical direction. In a similar manner to the case of the horizontal direction, a differential sum in the vertical direction can be calculated by the following equation.

$$\text{Differential sum (vertical)} = |W(2, 2) - W(2, 3)| \times 2 +$$
$$|W(2, 3) - W(2, 4)| \times 2 + |W(4, 2) - W(4, 3)| \times 2 + |W(4, 3) - W(4, 4)| \times 2$$

In FIG. 7D, arrow indicate pixels used for a differential summation in the left oblique direction. The directional property determination unit 33 weights respective differences with distances and calculates a sum of the absolute values of the differences. For example, a pair of W pixels at coordinates (1, 2) and (2, 3) are distant from the B pixel more than a pair of W pixels at coordinates (2, 3) and (3, 4) are. Therefore, a weighting coefficient of a pair of W pixels distant from the B pixel is "1".

Differential sum (left oblique) =

$|W(1, 2) - W(2, 3)| + |W(2, 3) - W(3, 4)| \times 2 + |W(3, 4) - W(4, 5)| +$ $|W(2, 1) - W(3, 2)| + |W(3, 2) - W(4, 3)| \times 2 + |W(4, 3) - W(5, 4)|$ In FIG. 7E, arrows indicate pixels used for a differential summation in the right oblique direction. In a similar manner to the case of the left oblique direction, respective differences can be weighted with distances to calculate a sum of the absolute values of the differences.

Differential sum (right oblique) =

$|W(1, 4) - W(2, 3)| + |W(2, 3) - W(3, 2)| \times 2 + |W(3, 2) - W(4, 1)| +$ $|W(2, 5) - W(3, 4)| + |W(3, 4) - W(4, 3)| \times 2 + |W(4, 3) - W(5, 2)|$ In respective equations for calculating differential sums in four directions, the total of the weighting coefficients of differences is eight. This allows for equal weightings among differential sums in the four directions. Further, pairs of W pixels (arrows) for calculating a differential sum are located line-symmetrically with respect to a target pixel (B pixel). A better symmetry of a differential sum can reduce errors in directional property determination. When an oblique differential sum is calculated, weighting coefficients of pairs of pixels neighboring to a target pixel are set to 2 and weighting coefficients of pairs of pixels distant from the target pixel are set to 1. In such a way, weighting the differences in accordance with the distance from a target pixel allows for a higher accuracy of a differential sum. Note that directions to be determined are not necessarily limited to four directions and may be two directions of a horizontal direction and a vertical direction or two oblique directions.

A direction having the smallest differential sum of four differential sums (horizontal, vertical, left oblique, and right oblique) calculated by the above process indicates that the difference of intensity is small, that is, the correlation is high. Therefore, the use of a plurality of pixels in a direction having the smallest differential sum allows for an accurate interpolation of a target pixel.

Figures 8A, 8B, 8C:
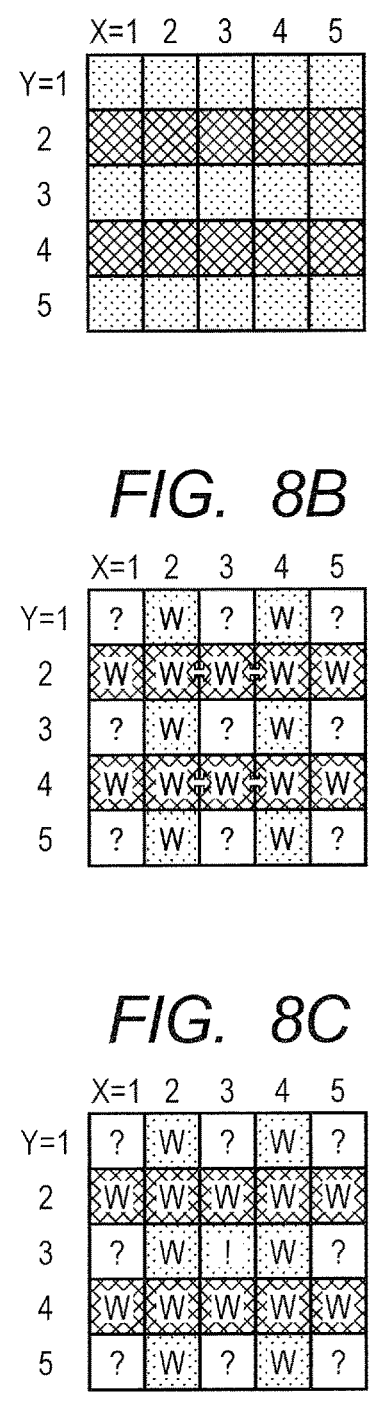

FIG. 8A to FIG. 8C illustrate an example of a result of an interpolation process. FIG. 8A illustrates an exposure pattern of a subject on a capturing plane of the imaging device 2. The exposure pattern includes an image whose differential sum in the horizontal direction is small such as a thin line or an edge extending in the horizontal direction. In FIG. 8A, two lines extending in the horizontal direction are exposed on the capturing plane, and the signal intensity of each pixel is schematically illustrated.

FIG. 8B illustrates levels of pixel values when the image of FIG. 8A is captured with the RGBW12 arrangement. Symbols "?" in the figure represent color pixels (R, G, B) other than W pixels, and a B pixel of coordinates (3, 3) is a target pixel. Light and shade of W pixels represents the level of a pixel value. The directional property determination unit 33 calculates each differential sum of W pixels near the target pixel in each direction and determines a direction with the smallest differential sum. Since the differential sum in the horizontal direction is the smallest in a thin line in the horizontal direction, the correlation of the intensity distribution in the horizontal direction is higher. In FIG. 8C, the interpolation processing unit 35 calculates an average value of the values of two W pixels located in the horizontal direction of the target pixel and interposing the target pixel and decides this average value as an interpolation value for the target pixel. A W pixel at coordinates (2, 3) and a W pixel at coordinates (4, 3) are located in the horizontal direction of the target pixel at coordinates (3, 3), respectively. The interpolation processing unit 35 decides the average value of the value of the W pixel at coordinates (2, 3) and the value of the W pixel at coordinates (4, 3) as the value at coordinates (3, 3).

In such a way, the directional property determination unit 33 determines a direction which has a correlation of an intensity distribution such as an edge or a thin line in a plurality of W pixels near a target pixel. The interpolation processing unit 35 can interpolate a value of the target pixel based on values of a plurality of W pixels located in a direction having a higher correlation (a smaller differential sum) with respect to the target pixel. With such interpolation, an interpolation process can be performed based on information of differences in a unit of one pixel, which can improve a resolution.

Figure 9:
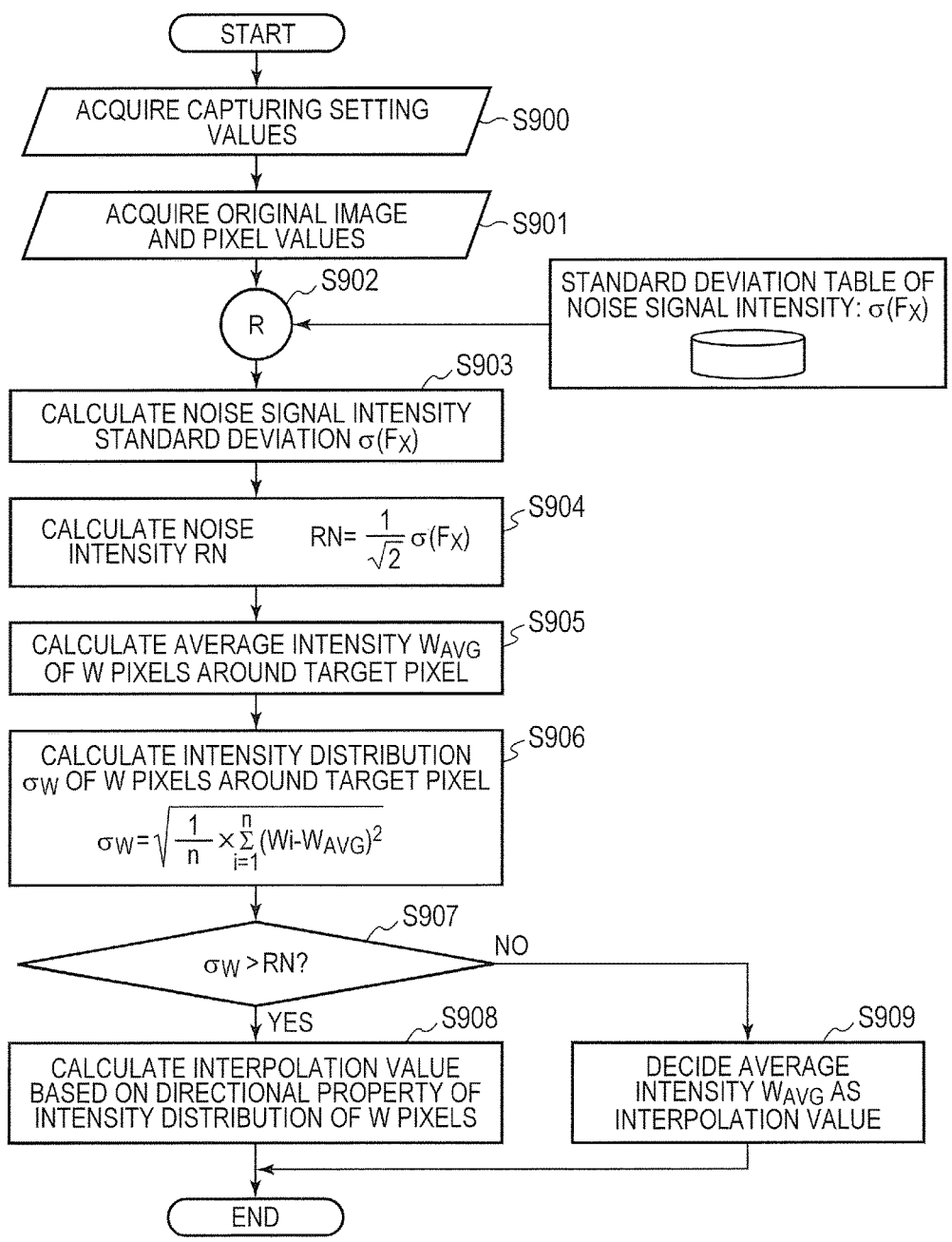
FIG. 9 is a flowchart of an image processing method in the first embodiment.

FIG. 9 illustrates a flowchart of an image processing method of an imaging system in the present embodiment. The imaging device 2 in this example has color filters of the RGBW12 arrangement illustrated in FIG. 4C.

Upon the imaging system 1 starting an operation, the general control and calculation unit 9 acquires, via the external I/F unit 6, capturing setting values such as an aperture value, a shutter speed, a distance, a gain value X, and the like input by a photographer (step S900). The gain value X is a sum of gains on a signal path from the pixel 21 to the signal processing unit 3 and, for example, includes a gain in the column amplifier 231, a digital gain in the signal processing unit 3, and the like.

Next, the general control and calculation unit 9 transmits the acquired capturing setting values to the imaging device 2, and the imaging device 2 performs a capturing operation based on the capturing setting values. The imaging device 2 outputs an image signal to the signal processing unit 3, and the pre-processing unit 31 of the signal processing unit 3 holds in the transitory storage unit 5 the image data 3a resulted by analog-to-digital conversion of the image signal (step S901). The separation processing unit 32 separates the image data 3a, which is the original image, into the W image data 3b and the color image data 3c and holds them in the transitory storage unit 5.

In the general control and calculation unit 9, lookup information (table) of noise image samples Fx corresponding to gain values X and a standard deviation $\sigma(Fx)$ of noise signal intensities is stored. Each noise image sample Fx is image data obtained in a state of no light being irradiated on the pixel unit 20 and includes noise only. Further, the noise image samples Fx may be prepared in advance for respective gain values. The signal processing unit 3 refers to a table of the standard deviations $\sigma(Fx)$ of noise signal intensities (step S902) and acquires the standard deviation $\sigma(Fx)$ of noise signal intensities corresponding to the input gain value X (step S903). The signal processing unit 3 obtains the noise intensity RN from the standard deviation $\sigma(Fx)$ of noise signal intensities according to the following equation (step S904).

$$RN = \frac{1}{\sqrt{2}} \sigma(Fx)$$

Next, the signal processing unit 3 determines whether an intensity variation of a value (brightness) of W pixels around a target pixel is due to a subject image or a noise. First, the correlation value calculation unit 34 acquires pixel values Wi of W pixels around the target pixel that is a color pixel on which an interpolation process is performed. The correlation value calculation unit 34 calculates average intensity $W_{AVG}$ of a plurality of pixel values Wi (step S905). The range of W pixels from which the pixel values are acquired is preferably a range with a distance of about one to three pixels in vertical, horizontal, and oblique directions around the target pixel. Based on the pixel values Wi and the average intensity $W_{AVG}$ of the W pixels acquired at step S905, the interpolation processing unit 35 then calculates an intensity dispersion (correlation) $\sigma_W$ of the W pixels around the target pixel according to the following equation (step S906):

$$\sigma_W = \sqrt{\frac{1}{n}\sum_{i=1}^{n}(Wi - W_{AWG})^2}$$

where n in this equation represents the number of W pixels in interest in calculating the intensity dispersion of the W pixels.

Next, the interpolation processing unit 35 compares the intensity dispersion $\sigma_W$ of the W pixels to the noise intensity RN (step S907). When the noise intensity RN is smaller than the intensity dispersion $\sigma_W$ of the W pixels ($\sigma_W$>RN), it can be determined that the intensity variation of the W pixels located around the color pixel in interest is due to the subject image. In this case (step S907, YES), the interpolation processing unit 35 can interpolate a pixel value (brightness) corresponding to a W pixel at the target pixel based on the directional property determination of the intensity distribution of the W pixels located around the target pixel (step S908). That is, the interpolation processing unit 35 calculates a W pixel values corresponding to the target pixel based on the W pixels in the direction determined by the directional property determination unit 33. Therefore, estimating the directional property of the intensity distribution can realize accurate interpolation while maintaining the frequency components of a subject.

If the noise intensity RN is equal to or greater than the intensity dispersion $\sigma_W$ of the W pixels ($\sigma_W$≤RN), it is not determined whether the intensity variation of the W pixels located around the color pixel in interest is due to a subject image or a noise. Therefore, in this case (step S907, NO), the interpolation processing unit 35 considers the average intensity $W_{AVG}$ of the W pixels around the target pixel to be a pixel value (brightness) corresponding to a W pixel at the target pixel to perform an interpolation process (step S909). That is, the value of the target pixel is the average intensity $W_{AVG}$. This can prevent a production of a false pattern which would otherwise be caused by erroneous determination of the directional property.

As described above, according to the present embodiment, it can be determined whether an intensity variation of W pixels around a color pixel in interest is due to a subject image or a noise. When it cannot be determined that the intensity variation of W pixels around a color pixel is likely to be due to a subject image, interpolation which does not depend on the direction of the intensity distribution is performed and therefore a production of a false pattern can be avoided. This allows for obtaining a high quality image in which a noise is suppressed while the high frequency components of the image data are maintained.

Note that the process order of respective steps is not necessarily limited to the order illustrated in the flowchart. Further, the image process illustrated in the flowchart may be executed in a general purpose computer that is outside the imaging system, or may be executed in the imaging device 2. The threshold used in the comparison to a correlation value can be any value based on the noise intensity RN, which may be a value obtained by multiplying the noise intensity RN by a predetermined coefficient or may be a value obtained by adding or subtracting a constant to or from the noise intensity RN, for example.

Second Embodiment

Figure 10:
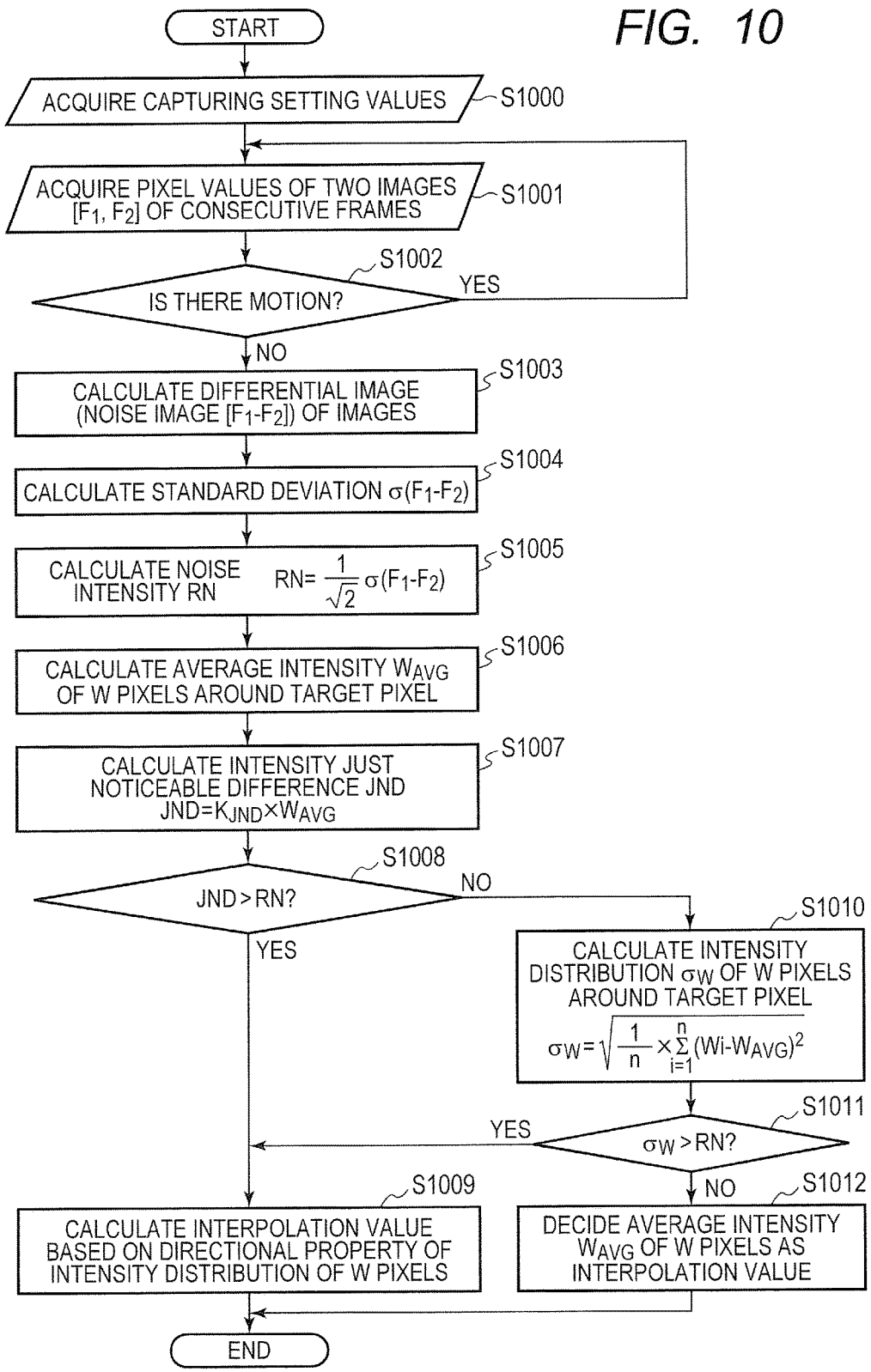
FIG. 10 is a flowchart of an image processing method in a second embodiment.

An imaging system in the second embodiment will be described. FIG. 10 illustrates a flowchart of an image processing method of the imaging system in the present embodiment. In a similar manner to the first embodiment, the imaging device 2 has color filters of the RGBW12 arrangement illustrated in FIG. 4C. In the present embodiment, multiple frames of image data that are temporally continuous can be processed. In the following, configurations that are different from those in the first embodiment will be mainly described.

Upon the imaging system 1 starting an operation, the general control and calculation unit 9 acquires, via the external I/F unit 6, capturing setting values (an aperture value, a shutter speed, a distance, a gain value X, and the like) input by a photographer (step S1000). Next, the general control and calculation unit 9 transmits the acquired capturing setting values to the imaging device 2, and the imaging device 2 performs a capturing operation based on the capturing setting value. The pre-processing unit 31 holds image data of each frame from the imaging device 2 in the transitory storage unit 5 (step S1001). It is assumed here that image data $F_1$ and $F_2$ of consecutive two frames (first and second frames) are stored in the transitory storage unit 5 and the capturing time of the image data $F_2$ occurs later than the capturing time of the image data $F_1$. The frame rate can be set to any value such as 1/60 seconds, 1/30 seconds, or the like, for example. The signal processing unit 3 determines whether or not there is a motion between the two image data $F_1$ and $F_2$ (step S1002). Although the determination of a motion can be made based on the level of a difference between two image data $F_1$ and $F_2$, for example, various determination methods can be used. When there is a motion between the image data $F_1$ and $F_2$ (step S1002, YES), the signal processing unit 3 again executes the process of step S1001 to acquire image data of the next frame from the imaging device 2. The image data $F_1$ at the previous time is replaced with the image data $F_2$ at the subsequent time in the transitory storage unit 5, and thus the image data $F_2$ is overwritten with the image data $F_1$. The signal processing unit 3 stores the image data of the next frame, which is newly output from the imaging device 2, in the transitory storage unit 5 as the image data $F_2$.

Until it is determined that there is no motion between image data $F_1$ and $F_2$ (step S1002, NO), the signal processing unit 3 repeatedly executes the processes of steps S1001 to S1002. When it is determined that there is no motion in the image (step S1002, NO), the signal processing unit 3 considers the image data $F_1$ and $F_2$ to be a static image and calculates a differential image (a noise image) of the image data $F_1$ and $F_2$ (step S1003). As a result of the differential operation, a subject image is removed and a noise component only is extracted.

Next, the correlation value calculation unit 34 performs a statistic analysis of the number of pixels occurring with respect to the noise signal intensity in the differential image of the image data $F_1$ and $F_2$ and obtains the standard deviation $\sigma(F_1-F_2)$ of the differential image between two frames (step S1004). The signal processing unit 3 obtains the noise intensity RN from the standard deviation $\sigma(F_X)$ of the noise signal intensity according to the following equation (step S1005).

$$RN = \frac{1}{\sqrt{2}} \sigma(F_1 - F_2)$$

Next, it is determined whether an intensity variation of the value (brightness) of W pixels around the target pixel in the image data $F_2$ at the new time is due to a subject image or a noise. First, the interpolation processing unit 35 calculates the average intensity $W_{AVG}$ from the values Wi of a plurality of W pixels around the target pixel (step S1006).

The correlation value calculation unit 34 then considers the average intensity $W_{AVG}$ of the W pixels to be a background intensity for the target pixel and calculates an intensity just noticeable difference (JND) according to the following equation (step S1007):

$$JND = K_{JND} \times W_{AVG}$$

where the coefficient $K_{JND}$ is determined based on the Weber-Fechner model and, when two objects having different brightness are placed before a background having certain brightness, represents the least brightness ratio between the background and the objects by which the brightness can be differentiated between two objects.

The interpolation processing unit 35 then determines whether the intensity just noticeable difference JND is greater or smaller than the noise intensity RN (step S1008). If the intensity just noticeable difference JND is greater than the noise intensity RN (JND>RN: step 1008, YES), the interpolation processing unit 35 interpolates a W pixel value corresponding to the target pixel based on the W pixels in the direction determined by the directional property determination unit 33. For example, when the intensity just noticeable difference JND is sufficiently greater than the noise intensity RN, it can be determined that the intensity variation in the W pixels around the target pixel is due to a subject image. In this case, the interpolation processing unit 35 interpolates a pixel value (brightness) corresponding to a W pixel at the target pixel based on the directional property determination of the intensity distribution of the W pixels around the target pixel (step S1009). As long as the noise intensity RN is less than the intensity just noticeable difference JND (JND>RN), the intensity variation of the W pixels located around the target pixel is considered to be caused by a signal from a subject, and an interpolation process based on the determined directional property can be performed. Note that, in the determination at step S1008, the threshold may be a value obtained by multiplying the noise intensity RN by a predetermined coefficient.

On the other hand, if the intensity just noticeable difference JND is less than or equal to the noise intensity RN (step S1008, NO), determination based on the intensity dispersion $\sigma_W$ of the W pixels is performed in a similar manner to the first embodiment (steps S1010 to S1011). That is, based on the intensity dispersion $\sigma_W$, it is determined whether the intensity variation of the W pixels around the target pixel is due to a subject or a noise. At step S1010, the interpolation processing unit 35 calculates the intensity dispersion $\sigma_W$ of the W pixels located around the target pixel (the following equation):

$$\sigma_W = \sqrt{\frac{1}{n} \sum_{i=1}^{n} (Wi - W_{AWG})^2}$$

where n in this equation represents the number of W pixels in interest when the intensity dispersion of the W pixels is calculated.

Next, at step S1011, the interpolation processing unit 35 compares the intensity dispersion $\sigma_W$ of the W pixels to the noise intensity RN. If the noise intensity RN is less than the intensity dispersion $\sigma_W$ of the W pixels ($\sigma_W$>RN), it can be determined that the intensity variation of the W pixels located around the color pixel in interest is due to a subject image. In this case (step S1011, YES), the interpolation processing unit 35 interpolates a pixel value (brightness) corresponding to a W pixel for the color pixel based on the directional property determination of the intensity distribution of the W pixels located around the color pixel. If the noise intensity RN is equal to or greater than the intensity dispersion $\sigma_W$ of the W pixels ($\sigma_W$ RN), it is not determined whether the intensity variation of the W pixels located around a desired color pixel is caused by a signal or a noise. Therefore, in this case (step S1011, NO), the average intensity $W_{AVG}$ of the W pixels around the target pixel is considered to be a pixel value (brightness) corresponding to a W pixel at the target pixel to perform an interpolation process (step S1012).

The present embodiment also allows for the same advantages as those in the first embodiment. That is, erroneous determination of the directional property can be avoided by determining whether an intensity variation of W pixels around a color pixel in interest is due to a subject image or a noise. For example, even when a shot noise of a subject image is not ignorable, erroneous determination of the directional property for the intensity distribution of W pixels can be prevented to suppress a generation of a false pattern. It is therefore possible to obtain an image having an image quality in which a noise is suppressed while high frequency components of image data are maintained.

Further, in the present embodiment, a noise intensity is calculated based on a difference of image data in multiple frames. This eliminates a need for preparing a standard deviation table of noises corresponding to the gain values X. Furthermore, the use of the intensity just noticeable difference JND in addition to the intensity dispersion $\sigma_W$ of W pixels as a correlation value enables further accurate estimation of the directional property of the intensity distribution and allows more accurate interpolation to be performed.

Third Embodiment

Subsequently, an imaging system in the third embodiment will be described. In the following, configurations that are different from those in the first and second embodiments will be mainly described.

FIG. 12A to FIG. 12C illustrate a pixel arrangement in the imaging device in the present embodiment, each of which depicts a pixel of five rows by five columns with a target pixel $C_{33}$ being at the center. In the imaging device 2, the same pixel arrangement is repeatedly arranged. The pixel arrangement of FIG. 12A has color pixels $C_{11}$, $C_{13}$, ..., $C_{55}$ and W pixels $W_{12}$, $W_{14}$, ..., $W_{54}$. Each of the color pixels is surrounded by eight W pixels, and thus the ratio of the number of color pixels to the number of W pixels is 1:3. W pixels are pixels which provide a sharper perception to brightness than color pixels and therefore used for determining the directional property of the intensity distribution of pixels. Color pixels are pixels which are used for acquiring color information, which are the RGB pixels that are the primary colors of the additive mixture of colors or the CyMgYe pixels that are the primary colors of the subtractive mixture of colors.

The pixel arrangement of FIG. 12B has color pixels $C_{11}$, $C_{13}$, ..., $C_{55}$ and G pixels $G_{12}$, $G_{14}$, ..., $G_{54}$. Also, the pixel arrangement of FIG. 12C has color pixels $C_{11}$, $C_{13}$, ..., $C_{55}$ and Ye pixels $Ye_{12}$, $Ye_{14}$, ..., $Ye_{54}$. G pixels and Ye pixels are pixels which have a sharper perception to brightness and include more brightness information than the color pixels C. Also in these pixel arrangements, each of the color pixels is surrounded by eight G pixels or eight Ye pixels, and thus the ratio of the number of color pixels to the number of G pixels or Ye pixels is 1:3.

Figure 11:
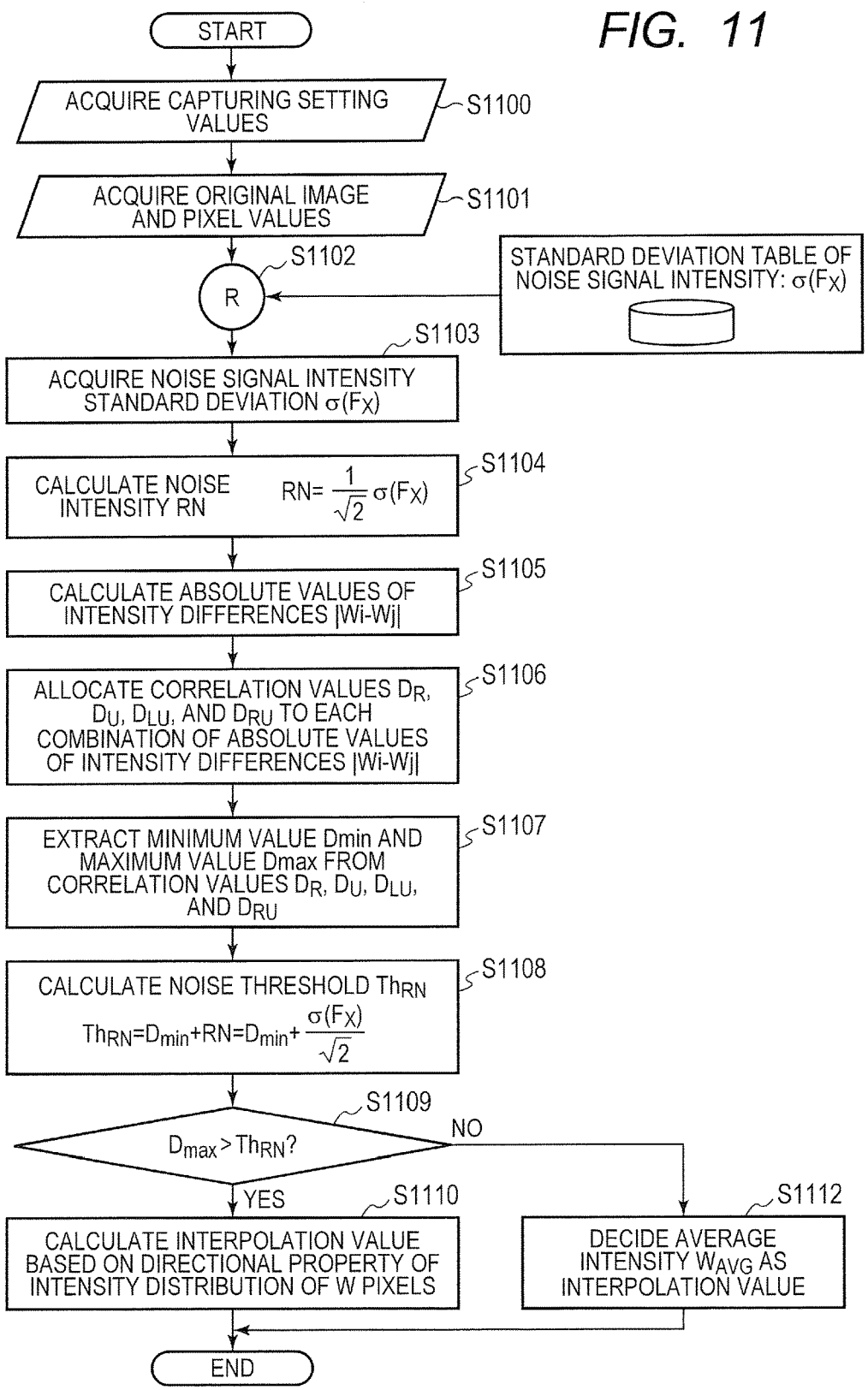
FIG. 11 is a flowchart of an image processing method in a third embodiment.

FIG. 11 illustrates a flowchart of an image processing method of an imaging system in the present embodiment. In the following description, while the imaging device 2 in the present embodiment has the pixel arrangement of FIG. 12A, other pixel arrangements may be used.

Since processes from steps S1100 to S1104 are the same as the processes (steps S900 to S904) of the imaging system in the first embodiment, the description thereof will be omitted. The signal processing unit 3 determines whether an intensity variation is due to a subject image or a noise in W pixels around the target pixel $C_{33}$. At step S1105, the signal processing unit 3 acquires values Wi and Wj of the W pixels around the target pixel $C_{33}$. Here, i and j represent positions that are different from each other around the target pixel. The signal processing unit 3 then calculates absolute values of differences (intensity value differences) |Wi−Wj| of two W pixels that are opposed interposing the target pixel $C_{33}$. For example, paired pixels are four pairs of ($W_{32}$, $W_{34}$), ($W_{23}$, $W_{43}$), ($W_{22}$, $W_{44}$), and ($W_{24}$, $W_{42}$). The signal processing unit 3 allocates the absolute values of intensity value differences |Wi−Wj| of these four pairs to correlation values $D_R$, $D_U$, $D_{LU}$, $D_{RU}$ for the directional property determination, respectively, according to the following equation (step S1106). Here, the correlation value $D_R$ represents the left-right (horizontal) directional property, and the correlation value Du represents the up-down (vertical) directional property. The correlation value $D_{LU}$ represents the oblique, left-upper and right-down directional property, and the correlation value $D_{RU}$ represents the oblique, right-upper and left-down directional property.

$$D_R = |Wi-Wj| = |W_{34}-W_{32}|$$

$$D_U = |Wi-Wj| = |W_{23}-W_{43}|$$

$$D_{LU} = |Wi-Wj| = |W_{22}-W_{44}|$$

$$D_{RU} = |Wi-Wj| = |W_{24}-W_{42}|$$

Note that a pair of W pixels used in calculation of a correlation value may be any position as long as they are located around the target pixel $C_{33}$ and located in the direction associated with that correlation value. A pair of W pixels are not necessarily neighboring to the target pixel $C_{33}$, and may be arranged separated from the target pixel $C_{33}$. For example, a pair of W pixels for calculation of the correlation value $D_R$ in the horizontal direction may be the pixels $W_{22}$ and $W_{21}$ that are located in the left-upper of the target pixel $C_{33}$ and neighboring to each other, or may be the pixels $W_{12}$ and $W_{14}$ that are located separated from the target pixel $C_{33}$. Possible combinations of W pixels for calculation of correlation values are indicated in the following equations.

$$D_R = |W_{14}-W_{12}|, |W_{22}-W_{21}|, |W_{23}-W_{22}|, |W_{24}-W_{23}|,$$
$$|W_{25}-W_{24}|, |W_{34}-W_{32}|, |W_{42}-W_{41}|, |W_{43}-W_{42}|,$$
$$|W_{44}-W_{43}|, |W_{45}-W_{44}|, |W_{54}-W_{52}|$$

$$D_U = |W_{25}-W_{45}|, |W_{14}-W_{24}|, |W_{24}-W_{34}|, |W_{34}-W_{44}|,$$
$$|W_{44}-W_{54}|, |W_{23}-W_{43}|, |W_{12}-W_{22}|, |W_{22}-W_{32}|,$$
$$|W_{32}-W_{42}|, |W_{42}-W_{52}|, |W_{21}-W_{41}|$$

$$D_{LU} = |W_{14}-W_{25}|, |W_{12}-W_{23}|, |W_{23}-W_{34}|, |W_{34}-W_{45}|,$$
$$|W_{22}-W_{44}|, |W_{21}-W_{32}|, |W_{32}-W_{43}|, |W_{43}-W_{54}|,$$
$$|W_{41}-W_{52}|$$

$$D_{RU} = |W_{12}-W_{21}|, |W_{14}-W_{23}|, |W_{23}-W_{32}|, |W_{32}-W_{41}|,$$
$$|W_{24}-W_{42}|, |W_{25}-W_{34}|, |W_{34}-W_{43}|, |W_{43}-W_{52}|,$$
$$|W_{45}-W_{54}|$$

Next, the signal processing unit 3 extracts the minimum value and the maximum value from the correlation values $D_R$, $D_U$, $D_{LU}$, and $D_{RU}$ (step S1107). Here, the minimum value is denoted as $D_{min}$, and the maximum value is denoted as $D_{max}$. A pair of W pixels in a direction associated with a correlation value having the minimum value $D_{min}$ have pixel values (intensity values) close to each other compared to a pair of W pixels in a direction associated with other correlation values. Therefore, the value of the target pixel $C_{33}$ has a correlation with a pixel value in a direction associated with a correlation value with the minimum value $D_{min}$. That is, the direction represented by the correlation value having the minimum value $D_{min}$ can be estimated to be a direction whose gradient (change) in the pixel values is small. For example, when the correlation value $D_R$ has the minimum value $D_{min}$, it can be estimated that a change in the plurality of values of W pixels located in the horizontal direction is small and the intensity distribution such as an edge of an image is the horizontal direction.

An interpolation process based on the estimated direction is based on the assumption that correlation values of two W pixels in other directions, in particular, the maximum value $D_{max}$ of the correlation value is larger than a value obtained by adding the noise intensity amplitude to the minimum value $D_{min}$. Thus, the signal processing unit 3 determines whether or not to use a result of the directional property determination in an interpolation process (steps S1108 to S1109). First, at step S1108, the signal processing unit 3 adds the noise intensity RN to the minimum value $D_{min}$ of the correlation value to calculate a threshold $Th_{RN}$ according to the following equation.

$$Th_{RN} = D_{min} + RN = D_{min} + \frac{\sigma(Fx)}{\sqrt{2}}$$

Next, at step S1109, the signal processing unit 3 compares the maximum value $D_{max}$ of the correlation value with the threshold $Th_{RN}$ to determine whether or not to use a result of the directional property determination in an interpolation process. If the maximum value $D_{max}$ of the correlation value is greater than the threshold $Th_{RN}$, that is, $D_{max} > Th_{RN}$ (step S1109, YES), the intensity variation of the W pixels located around the target pixel can be considered to be caused by a subject image. In this case, the signal processing unit 3 calculates an interpolation value for the target pixel based on the values of the W pixels in the direction associated with a correlation value having the minimum value $D_{min}$ (step S1100). For example, when the correlation value $D_R$ in the horizontal direction has the minimum value $D_{min}$, the signal processing unit 3 can determine that an interpolation value of two pixels $W_{32}$ and $W_{34}$ located in the horizontal direction to the target pixel $C_{33}$ is a value of the target pixel $C_{33}$.

On the other hand, if the maximum value $D_{max}$ in a correlation value is equal to or smaller than the threshold $Th_{RN}$ ($D_{max} \leq Th_{RN}$), it is not distinguished whether the intensity variation of the W pixels located around the target pixel is due to a subject image or a noise. In this case (step S1109, NO), the signal processing unit 3 considers the average intensity $W_{AVG}$ of the W pixels located around the target pixel to be a pixel value (brightness) corresponding to a W pixel at the target pixel to perform an interpolation process.

As described above, according to the present embodiment, it can be determined whether an intensity variation (gradient) of W pixels located around a color pixel in interest is due to a subject image or a noise. Since an edge portion of an image can be extracted and erroneous determination in the edge portion extraction can be suppressed, generation of a false pattern can be avoided. It is therefore possible to increase the image quality of image data.

Fourth Embodiment

An imaging system of the present embodiment will be described mainly for configurations that are different from those in the first embodiment. FIG. 13A to FIG. 13E are diagrams illustrating a directional property determination process in the present embodiment. The signal processing unit 3 of the present embodiment performs weighting in accordance with distances to pixels where the directional properties are determined and calculates a differential sum.

FIG. 13A is a diagram illustrating the distances from a target pixel at coordinates (3, 3) to two W pixels for calculation of differences in the RGBW12 pixel arrangement. Here, a distance from the centroid of a target pixel to the centroid of two W pixels for calculation of differences is defined as a simple calculation distance. The centroid of the pixel can be the centroid of a micro-lens provided associated with a pixel on the semiconductor substrate of the pixel unit 20, for example. Further, in a pixel having only one photoelectric conversion element PD, the centroid of a pixel can be the centroid of the photoelectric conversion element PD. The centroid of two pixels is the middle point of a line connecting respective centroids of the pixels. Further, the pitch of pixels is assumed to be 2 and the simple calculation distance is calculated as follows.

In FIG. 13A, the simple calculation distance 131 of a difference in the vertical direction |W(2, 2)–W(2, 3)| and B (3, 3) is the square root of 3. Also, the simple calculation distance 132 of a difference in the vertical direction |W(2, 1)–W(2, 2)| and B (3, 3) is the square root of 13, where the pitch of pixels is 2. Further, the simple calculation distance 133 of a difference in the oblique direction |W(3, 2)–W(4, 3)| and B (3, 3) is the square root of 2. Also, the simple calculation distance 134 of a difference in the oblique direction |W(4, 3)–W(5, 4)| and B (3, 3) is the square root of 10.

A simple calculation distance calculated in such a way is multiplied by a weighting coefficient of difference, and a sum of the multiplication results is defined as a calculation distance. For example, when the weighting coefficient of difference in the vertical direction in the first embodiment is 2, the calculation distance (vertical) is calculated as follows:

Calculation distance(vertical)=2×√3+2×√3+2×√3+2×√3=8√3

In a similar manner, the calculation distance in other directions are calculated as follows:

Calculation distance(horizontal)=8√3

Calculation distance(right oblique)=4√2+4√10

Calculation distance(left oblique)=4√2+4√10

In the example described above, each of the calculation distances in the vertical and horizontal directions is approximately 13.8, each of the calculation distances in the oblique directions is approximately 18.3, and therefore the ratio of these two calculation distances is approximately 1.3. The fact that calculation distances in respective directions are different means that determination of spatial directional properties are different in respective directions. With differential sum calculation distances being different in respective directions, an error would occur in determination of the directional property. It is therefore preferable that calculation distances in respective directions be the same and that the ratio of the maximum value to the minimum value of the calculation distances be less than or equal to 2.

In the present embodiment, differences are acquired in the neighboring pixels indicated by arrows in FIG. 13B, FIG. 13C, FIG. 13D, and FIG. 13E to obtain differential sums resulted by multiplying respective differences by the following weighting coefficients. The differential sums in respective directions are calculated as follows.

Differential sum (horizontal) =
|W(1, 2) − W(2, 2)| + |W(2, 2) − W(3, 2)|×3 +
|W(3, 2) − W(4, 2)|×3 + |W(4, 2) − W(5, 2)| + |W(1, 4) − W(2, 4)| +
|W(2, 4) − W(3, 4)|×3 + |W(3, 4) − W(4, 4)|×3 + |W(4, 4) − W(5, 4)|

Differential sum (vertical) = |W(2, 1) − W(2, 2)| + |W(2, 2) − W(2, 3)|×3 +
|W(2, 3) − W(2, 4)|×3 + |W(2, 4) − W(2, 5)| + |W(4, 1) − W(4, 2)| +
|W(4, 2) − W(4, 3)|×3 + |W(4, 3) − W(4, 4)|×3 + |W(4, 4) − W(4, 5)|

Differential sum (left oblique) =
|W(1, 2) − W(2, 3)|×2 + |W(2, 3) − W(3, 4)|×2 +
|W(3, 4) − W(4, 5)|×2 + |W(2, 1) − W(3, 2)|×2 +
|W(3, 2) − W(4, 3)|×2 + |W(4, 3) − W(5, 4)|×2

Differential sum (right oblique) =
|W(1, 4) − W(2, 3)|×2 + |W(2, 3) − W(3, 2)|×2 + |W(3, 2) − W(4, 1)|×2 +
|W(2, 5) − W(3, 4)|×2 + |W(3, 4) − W(4, 3)|×2 + |W(4, 3) − W(5, 2)|×2

In the differential sums described above, the calculation distances in respective directions are as follows:

Calculation distance(horizontal)=4√13+12√3

Calculation distance(vertical)=4√13+12√3

Calculation distance(left oblique)=8√10+8√2

Calculation distance(right oblique)=8√10+8√2

Each of the calculation distance in the vertical and horizontal directions is approximately 35.2, each of the calculation distance in the oblique directions is approximately 36.6, and the ratio thereof is approximately 1.04. According to the present embodiment, the calculation distances can be equal in respective directions, which allows for more accurate determination of the directional property of an intensity distribution. Further, also in the present embodiment, whether an intensity distribution is due to a subject image or a noise is determined, which can prevent generation of a false pattern which would otherwise be caused by erroneous determination of the directional property.

Other Embodiments

While the imaging devices according to the present invention have been described above, the present invention is not limited to the embodiments described above, and these embodiments do not restrict various modifications and variations without departing from the spirit of the present invention. For example, the configurations of the first to fourth embodiments described above can be combined. Further, the imaging system may not necessarily have the imaging device, and may be an image processing apparatus such as a computer that processes image signals output from the imaging device. In this case, the imaging device can be input with RAW data from a pixel signal and perform the processes described above. Further, the imaging device may have the signal processing unit and thereby perform the processes described above.

Embodiments of the present invention can also be realized by a computer of a system or apparatus that reads out and executes computer-executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer-executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer-executable instructions. The computer-executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-Ray Disc (BD)™), a Flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-038706, filed Mar. 1, 2016, which is hereby incorporated by reference herein in its entirety.

What is claimed is:

1. An imaging device comprising:
a pixel unit in which at least one first pixel and a plurality of second pixels are arranged in a matrix, wherein the plurality of second pixels are arranged around the first pixel, and each of the plurality of second pixels is able to provide more brightness information than is provided by the first pixel;
a directional property determination unit that determines a direction of an intensity distribution based on differences among values of the plurality of second pixels;
a correlation value calculation unit that calculates a correlation value of the values of the plurality of second pixels; and
an interpolation processing unit that, when the correlation value is greater than a threshold that is based on a noise signal intensity in the values of the plurality of second pixels, interpolates a value of the first pixel based on the direction of the intensity distribution from the values of the plurality of second pixels and, when the correlation value is less than or equal to the threshold, interpolates the value of the first pixel from the values of the plurality of second pixels without depending on the direction of the intensity distribution.

2. The imaging device according to claim 1, wherein the correlation value is a dispersion of the values of the plurality of second pixels located around the first pixel.

3. The imaging device according to claim 1, wherein the correlation value is an absolute value of a difference between the values of the plurality of second pixels located around the first pixel.

4. The imaging device according to claim 1, wherein the correlation value is an intensity just noticeable difference for an average value of the values of the plurality of second pixels located around the first pixel.

5. The imaging device according to claim 1, wherein each of the plurality of second pixels has a spectral sensitivity characteristic whose full width half maximum is wider than that of a spectral sensitivity characteristic of the first pixel.

6. The imaging device according to claim 1, wherein each of the plurality of second pixels is a white pixel.

7. The imaging device according to claim 1, wherein the at least one first pixel comprises a plurality of the first pixels, and the plurality of the first pixels comprise a red pixel, a green pixel, and a blue pixel.

8. The imaging device according to claim 1, wherein the at least one first pixel comprises a plurality of the first pixels, and the plurality of the first pixels comprise a cyan pixel, a magenta pixel, and a yellow pixel.

9. The imaging device according to claim 1, wherein the number of the second pixels is three or more times the number of the first pixels.

10. The imaging device according to claim 1, wherein the first pixel is surrounded by the plurality of second pixels.

11. The imaging device according to claim 1, wherein the threshold is calculated based on a noise image sample prepared correspondingly to gains of the values of the plurality of second pixels.

12. The imaging device according to claim 1, wherein the threshold is calculated based on an inter-frame difference between values of the plurality of second pixels in a first frame and values of the plurality of second pixels in a second frame.

13. The imaging device according to claim 12, wherein the threshold is calculated when no motion of an image is detected between the first frame and the second frame.

14. The imaging device according to claim 1, wherein the directional property determination unit determines the direction based on a difference between values of a pair of the second pixels of the plurality of second pixels and a distance from a centroid of the first pixel to a centroid of the pair of the second pixels.

15. An imaging system comprising an imaging device and an image processing unit that processes image data output from the imaging device, wherein the imaging device comprises:
 a pixel unit in which a first pixel and a plurality of second pixels are arranged in a matrix, wherein the plurality of second pixels are arranged around the first pixel, and each of the plurality of second pixels is able to provide more brightness information than is provided by the first pixel;
 a directional property determination unit that determines a direction of an intensity distribution based on differences among values of the plurality of second pixels;
 a correlation value calculation unit that calculates a correlation value of the values of the plurality of second pixels; and
 an interpolation processing unit that, when the correlation value is greater than a threshold that is based on a noise signal intensity in the values of the plurality of second pixels, interpolates a value of the first pixel based on the direction of the intensity distribution from the values of the plurality of second pixels and, when the correlation value is less than or equal to the threshold, interpolates the value of the first pixel from the values of the plurality of second pixels without depending on the direction of the intensity distribution.

16. An image processing method for processing a signal output from an imaging device, the imaging device comprising: a pixel unit including a first pixel and a plurality of second pixels arranged in a matrix, wherein the plurality of second pixels are arranged around the first pixel, and each of the plurality of second pixels is able to provide more brightness information than is provided by the first pixel, a processor, and a memory, the method, executed by the processor, comprising:
 determining a direction of an intensity distribution based on differences among values of the plurality of second pixels;
 calculating a correlation value of the values of the plurality of second pixels; and
 when the correlation value is greater than a threshold that is based on a noise signal intensity in the values of the plurality of second pixels, interpolating a value of the first pixel based on the direction of the intensity distribution from the values of the plurality of second pixels and, when the correlation value is less than or equal to the threshold, interpolating the value of the first pixel from the values of the plurality of second pixels without depending on the direction of the intensity distribution.

17. An imaging device comprising:
 a pixel unit in which at least one color pixel and a plurality of white pixels other than the color pixel are arranged in a matrix, wherein the plurality of white pixels are arranged around the color pixel;
 a directional property determination unit that determines a direction of an intensity distribution based on differences among values of the plurality of white pixels;
 a correlation value calculation unit that calculates a correlation value of the values of the plurality of white pixels; and
 an interpolation processing unit that, when the correlation value is greater than a threshold that is based on a noise signal intensity in the values of the plurality of white pixels, interpolates a value of the color pixel based on the direction of the intensity distribution from the values of the plurality of white pixels and, when the correlation value is less than or equal to the threshold, interpolates the value of the color pixel from the values of the plurality of white pixels without depending on the direction of the intensity distribution.

18. The imaging device according to claim 17, wherein the correlation value is a dispersion of the values of the plurality of white pixels located around the color pixel.

19. The imaging device according to claim 17, wherein the number of the white pixels is three or more times the number of the color pixels.

20. The imaging device according to claim 17, wherein the color pixel is surrounded by the plurality of white pixels.

* * * * *